United States Patent
Chae et al.

(10) Patent No.: US 10,128,853 B2
(45) Date of Patent: Nov. 13, 2018

(54) DELAY LOCKED LOOP CIRCUIT AND INTEGRATED CIRCUIT INCLUDING THE SAME

(71) Applicant: SAMSUNG ELECTRONICS CO., LTD., Suwon-si (KR)

(72) Inventors: Kwan-yeob Chae, Hwaseong-si (KR); Shin-young Yi, Seoul (KR); Hyung-kweon Lee, Incheon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/475,310

(22) Filed: Mar. 31, 2017

(65) Prior Publication Data

US 2018/0048319 A1 Feb. 15, 2018

(30) Foreign Application Priority Data

Aug. 12, 2016 (KR) .................. 10-2016-0103205
Feb. 15, 2017 (KR) .................. 10-2017-0020712

(51) Int. Cl.
*H03L 7/08* (2006.01)
*H03L 7/06* (2006.01)
*H03L 1/00* (2006.01)
*H03L 7/081* (2006.01)

(52) U.S. Cl.
CPC .............. *H03L 1/00* (2013.01); *H03L 7/0814* (2013.01)

(58) Field of Classification Search
CPC .................. H03L 1/00; H03L 7/0814
See application file for complete search history.

(56) References Cited

U.S. PATENT DOCUMENTS

| | | | |
|---|---|---|---|
| 6,492,852 B2 | 12/2002 | Fiscus | |
| 7,279,946 B2 * | 10/2007 | Minzoni | H03L 7/0814 327/149 |
| 7,327,174 B2 | 2/2008 | Fan et al. | |
| 7,365,583 B2 * | 4/2008 | Shin | H03L 7/0814 327/149 |
| 7,701,274 B2 | 4/2010 | Chae | |
| 7,746,135 B2 * | 6/2010 | Schneider | H03L 7/07 327/149 |
| 9,356,611 B1 | 5/2016 | Shyu et al. | |
| 2002/0180500 A1 | 12/2002 | Okuda et al. | |
| 2009/0115479 A1 | 5/2009 | Gomm et al. | |
| 2014/0225651 A1 | 8/2014 | Haerle et al. | |

* cited by examiner

*Primary Examiner* — Kenneth B Wells
(74) *Attorney, Agent, or Firm* — Sughrue Mion, PLLC

(57) ABSTRACT

A delay-locked loop (DLL) circuit and an integrated circuit (IC) including the same are provided. The DLL circuit includes a pre-processing circuit configured to generate a first pulse signal and a second pulse signal based on a clock signal input, the first pulse signal and the second pulse signal having a phase difference of (s/2) times a clock period of the clock signal (where s is a positive integer), a delay line configured to generate a delay signal by delaying the first pulse signal by a delay amount corresponding to a selection value, a phase detector configured to detect a phase difference between the delay signal and the second pulse signal, and a control logic configured to adjust the selection value based on the phase difference between the delay signal and the second pulse signal as detected by the phase detector, so as to synchronize the delay signal with the second pulse signal.

20 Claims, 21 Drawing Sheets

< LEADING STATE >

< LAGGING STATE>

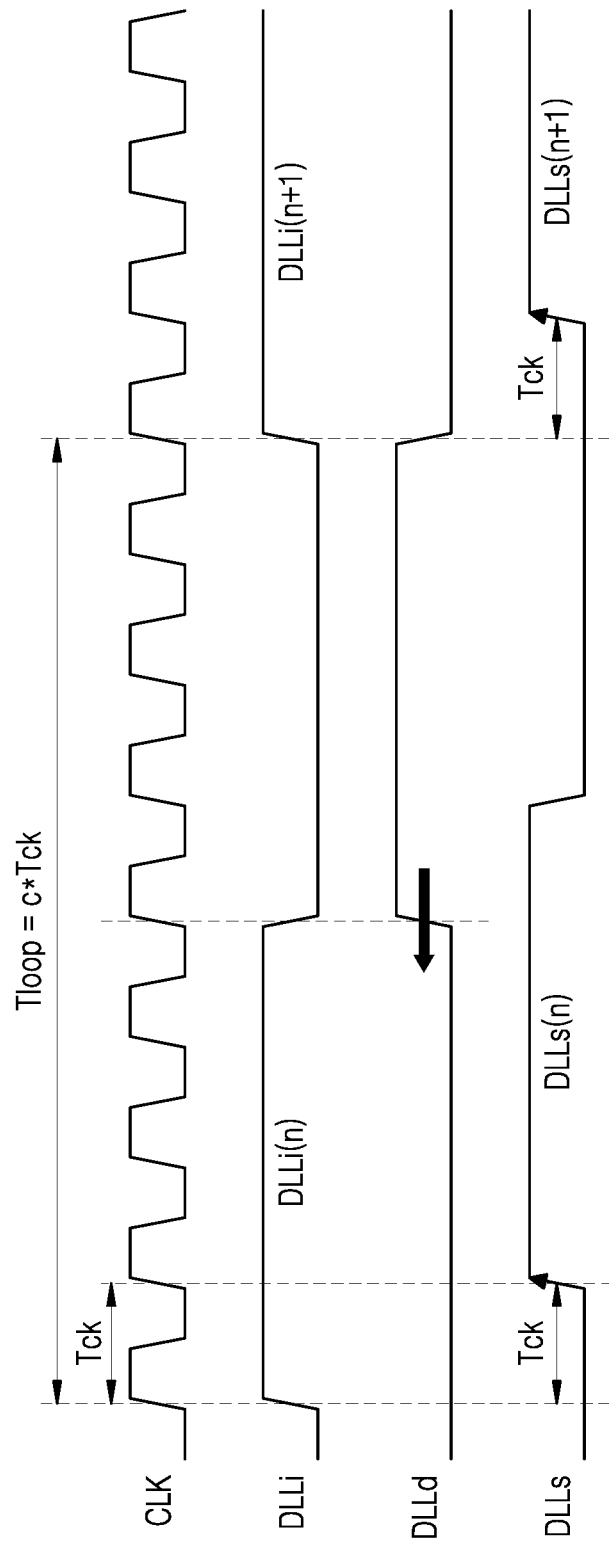

FIG. 11C

| TDref | Tck2 | TDts | SELs |
|---|---|---|---|
| Tck | Tck | 90° (1/4*Tck2) | 1/4*SEL |
| | | 180° (1/2*Tck2) | 1/2*SEL |
| | | 270° (3/4*Tck2) | 3/4*SEL |
| | | 360° (Tck2) | SEL |
| | 2*Tck | 90° (1/4*Tck2) | 1/2*SEL |
| | | 180° (1/2*Tck2) | SEL |
| | | 270° (3/4*Tck2) | 3/2*SEL |
| | | 360° (Tck2) | 2*SEL |
| 2*Tck | Tck | 90° (1/4*Tck2) | 1/8*SEL |
| | | 180° (1/2*Tck2) | 1/4*SEL |
| | | 270° (3/4*Tck2) | 3/8*SEL |
| | | 360° (Tck2) | 1/2*SEL |
| | 2*Tck | 90° (1/4*Tck2) | 1/4*SEL |
| | | 180° (1/2*Tck2) | 1/2*SEL |
| | | 270° (3/4*Tck2) | 3/4*SEL |
| | | 360° (Tck2) | SEL |

DELAY LOCKED LOOP CIRCUIT AND INTEGRATED CIRCUIT INCLUDING THE SAME

CROSS-REFERENCE TO RELATED APPLICATIONS

This application claims priority from Korean Patent Application Nos. 10-2016-0103205, filed on Aug. 12, 2016, and 10-2017-0020712, filed on Feb. 15, 2017, in the Korean Intellectual Property Office, the disclosures of which are incorporated herein in their entireties by reference.

BACKGROUND

1. Field

Methods and apparatuses consistent with exemplary embodiments relate to a semiconductor device, and more particularly, to a delay-locked look (DLL) circuit and an integrated circuit (IC) including the same.

2. Description of the Related Art

A DLL circuit controls a delay line so that a phase of an input clock signal matches phases of a feedback signal output through the delay line. In order to compensate for process, voltage, and temperature (PVT) variations, a master DLL circuit may detect a selection value corresponding to a lock state and provide the selection value to a slave DLL circuit. The slave DLL circuit may generate an internal clock signal by delaying the input clock signal by a target delay amount based on the selection value. Since the selection value changes according to PVT, the slave DLL circuit may constantly maintain a phase difference between the input clock signal and the internal clock signal by compensating for a change in the input clock signal according to PVT variations, based on the selection value.

SUMMARY

Various exemplary embodiments may address at least the above problems and/or disadvantages and other disadvantages not described above. Also, the exemplary embodiments are not required to overcome the disadvantages described above, and an exemplary embodiment may not overcome any of the problems described above.

According to an aspect of an exemplary embodiment, there is provided a DLL circuit including a pre-processing circuit configured to generate a first pulse signal and a second pulse signal based on a clock signal input thereto, the first pulse signal and the second pulse signal having a phase difference of (s/2) times a clock period of the clock signal (where s is a positive integer), a delay line configured to receive the first pulse signal and generate a delay signal by delaying the first pulse signal by a delay amount corresponding to a selection value, a phase detector configured to receive the delay signal and the second pulse signal and detect a phase difference between the delay signal and the second pulse signal, and a control logic configured to adjust the selection value based on the phase difference detected by the phase detector, so as to synchronize the delay signal with the second pulse signal.

According to an aspect of an exemplary embodiment, there is provided an integrated circuit (IC) including a digital DLL circuit configured to generate a reference selection value corresponding to a reference delay amount based on a first pulse signal and a second pulse signal generated based on a first clock signal, and at least one slave DLL circuit configured to generate an internal clock signal by delaying a second clock signal based on the reference selection value. The digital DLL circuit may include a pre-processing circuit configured to generate, based on the first clock signal, the first pulse signal and the second pulse signal having a phase difference corresponding to the reference delay amount, a delay line configured to receive the first pulse signal and generate a delay signal by delaying the first pulse signal by a delay amount corresponding to a selection value, a phase detector configured to receive the delay signal and the second pulse signal and detect a phase difference between the delay signal and the second pulse signal; and a control logic configured to adjust the selection value based on the phase difference detected by the phase detector and provide the selection value, which is selected to have the delay signal synchronized with the second pulse signal, as the reference selection value to the at least one slave DLL circuit.

According to an aspect of an exemplary embodiment, there is provided a method including generating, at a delay-locked loop (DLL) circuit, a first pulse signal and a second pulse signal based on a clock signal input, the first pulse signal and the second pulse signal having a first phase difference of (s/2) times a clock period of the clock signal input, wherein s is a positive integer; generating a first delay signal by delaying the first pulse signal by a first delay amount corresponding to a first selection value; detecting a second phase difference between the first delay signal and the second pulse signal; determining a second selection value based on the second phase difference; and generating a second delay signal by delaying the first pulse signal by a second delay amount corresponding to the second selection value.

BRIEF DESCRIPTION OF THE DRAWINGS

Exemplary embodiments of the present disclosure will be more clearly understood from the following detailed description taken in conjunction with the accompanying drawings in which:

FIGS. 8A to 8C are timing diagrams for describing operations of a DLL circuit, according to an exemplary embodiment;

FIG. 11C illustrates various embodiments of setting the slave selection value of the integrated circuit of FIG. 11A.

DETAILED DESCRIPTION OF THE EMBODIMENTS

Hereinafter, exemplary embodiments of the inventive concept will be described with reference to the accompanying drawings.

Figure 1:
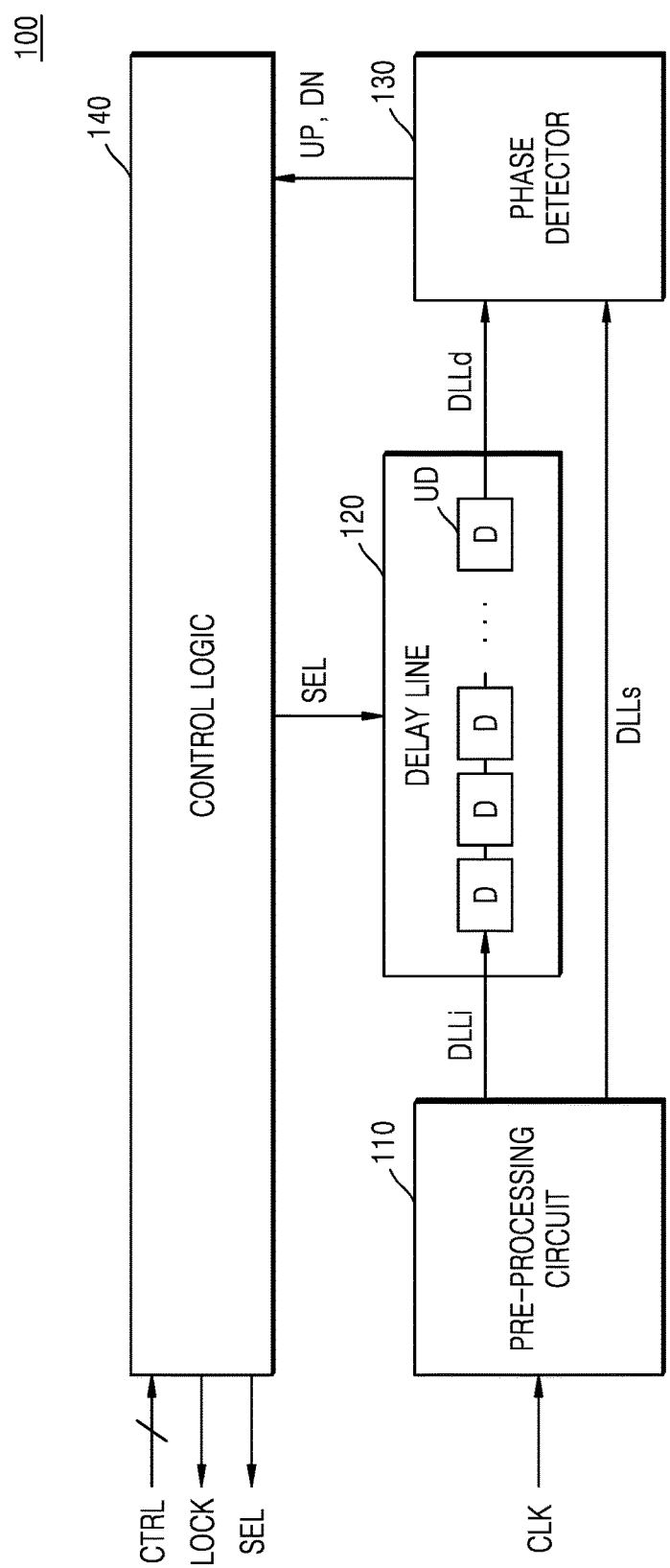
FIG. 1 is a block diagram of a delay-locked loop (DLL) circuit according to an exemplary embodiment.

FIG. 1 is a block diagram of a delay-locked loop (DLL) circuit 100 according to an exemplary embodiment.

The DLL circuit 100 may be a digital DLL circuit and may also be a master DLL circuit. The DLL circuit 100 may detect a reference selection value corresponding to a lock state in which a phase of a clock signal CLK is equal to a phase of a feedback signal, and provide the reference selection value to another circuit, for example, a slave DLL circuit.

The DLL circuit 100 may be mounted on a clock synchronization circuit, such as an application processor (AP), a solid-state drive (SSD) controller, a system on chip (SoC), or the like. Also, the DLL circuit 100 may be mounted on various types of semiconductor devices configured to compensate for process, voltage, and temperature (PVT) variations by using the DLL circuit 100.

As shown in FIG. 1, the DLL circuit 100 may include a pre-processing circuit 110, a delay line 120, a phase detector 130, and a control logic 140.

The pre-processing circuit 110 may pre-process a clock signal CLK input thereto and generate a first pulse signal DLLi and a second pulse signal DLLs. The pre-processing circuit 110 may generate the first pulse signal DLLi and the second pulse signal DLLs based on the clock signal CLK. The clock signal CLK may also be referred to as a reference clock signal. The first pulse signal DLLi may also be referred to as a delay line input signal and the second pulse signal DLLs may also be referred to as a phase reference signal.

The first pulse signal DLLi and the second pulse signal DLLs may have a phase difference based on a clock period Tck of the clock signal CLK. A phase difference between signals as used herein means a period between a rising edge (or falling edge) of one signal and a rising edge (or falling edge) of another signal. Accordingly, a period between a rising edge (or falling edge) of an n-th pulse of the first pulse signal DLLi and a rising edge (or falling edge) of an n-th pulse of the second pulse signal DLLs may be based on the clock period Tck of the clock signal CLK. A phase of the first pulse signal DLLi may lead a phase of the second pulse signal DLLs, and a phase difference between the first pulse signal DLLi and the second pulse signal DLLs may be s/2 times the clock period Tck (i.e., $(s/2) \times Tck$, where s is a positive integer). The phase of the first pulse signal DLLi may lead the phase of the second pulse signal DLLs by $0.5 \times Tck$ or more. For example, the phase of the first pulse signal DLLi may lead the phase of the second pulse signal DLLs by $0.5 \times Tck$, Tck, $1.5 \times Tck$, $2 \times Tck$, etc. However, embodiments of the inventive concept are not limited thereto. The phase of the first pulse signal DLLi may lead the phase of the second pulse signal DLLs by $(s/2) \times Tck$.

The phase difference between the first pulse signal DLLi and the second pulse signal DLLs may correspond to a reference delay amount (or, referred to a reference phase difference) set to the DLL circuit 100. For example, when the reference delay amount of the DLL circuit 100 is set to be $2 \times Tck$, the pre-processing circuit 110 may generate the first pulse signal DLLi and the second pulse signal DLLs having a phase difference of $2 \times Tck$. The pre-processing circuit 110 may set the phase difference between the first pulse signal DLLi and the second pulse signal DLLs to correspond to the reference delay amount, based on a timing control signal provided from an external circuit or the control logic 140.

The delay line 120 may receive the first pulse signal DLLi and propagate the first pulse signal DLLi to generate a delay signal DLLd. The delay line 120 may generate the delay signal DLLd by delaying the first pulse signal DLLi by a delay amount (i.e., propagation delay amount) corresponding to a selection value SEL. The selection value SEL may also be referred to as a delay value, and the delay signal DLLd may also be referred to as a feedback signal.

According to an aspect of an exemplary embodiment, the delay line 120 may be a digital control delay line. The delay line 120 may include a plurality of unit delay cells UD. Some of the unit delay cells UD may be selected based on the selection value SEL. The delay amount of the delay line 120 may be determined based on a unit delay amount of the unit delay cell UD and the number of selected unit delay cells UD. When the selection value SEL increases, the delay amount of the delay line 120 may increase, and when the selection value SEL decreases, the delay amount of the delay line 120 may decrease. Accordingly, when the selection value SEL increases, a phase of the delay signal DLLd may lag more than before the increasing of the selection value SEL. When the selection value SEL decreases, a phase of the delay signal DLLd may be advanced more than before the decreasing of the selection value SEL.

The phase detector 130 may receive the delay signal DLLd and the second pulse signal DLLs and detect a phase difference between the delay signal DLLd and the second pulse signal DLLs. For example, the phase detector 130 may detect whether the phase of the delay signal DLLd leads or lags behind the phase of the second pulse signal DLLs. According to an aspect of an exemplary embodiment, the phase detector 130 may detect the phase difference between the delay signal DLLd and the second pulse signal DLLs by sampling a level of the delay signal DLLd at each rising edge or each falling edge of the second pulse signal DLLs. For example, when the level of the delay signal DLLd is logic high at the rising edge of the second pulse signal DLLs, the phase detector 130 may determine that the phase of the delay signal DLLd leads the phase of the second pulse signal DLLs. When the level of the delay signal DLLd is logic low, the phase detector 130 may determine that the phase of the delay signal DLLd lags behind the phase of the second pulse signal DLLs.

The phase detector 130 may output an up signal UP or a down signal DN to the control logic 140 according to a result of the detecting. For example, when the phase of the delay signal DLLd leads the phase of the second pulse signal DLLs, the phase detector 130 may output the up signal UP indicating an instruction to increase the delay amount, and when the phase of the delay signal DLLd lags behind the phase of the second pulse signal DLLs, the phase detector 130 may output the down signal DN indicating an instruction to decrease the delay amount.

The control logic 140 may adjust the selection value SEL based on the phase difference detected by the phase detector 130, so that the delay signal DLLd is synchronized with the second pulse signal DLLs, that is, the phase of the delay signal DLLd is equal to the phase of the second pulse signal DLLs. For example, the control logic 140 may increase the selection value SEL based on the up signal UP, or may decrease the selection value SEL based on the down signal DN.

The control logic 140 may set an initial value of the selection value SEL (hereinafter, referred to as an initial selection value SEL0) and a unit increase value or a unit decrease value, based on a control signal CTRL. According to an aspect of an exemplary embodiment, the control signal CTRL may be provided from an external circuit (e.g., a DLL control circuit). Alternatively, the control signal CTRL may be set in advance. The initial selection value SEL0, the unit increase value, or the unit decrease value may be set in advance. According to an aspect of an exemplary embodiment, the unit increase value and the unit decrease value may be equal to each other.

The control logic 140 may adjust the selection value SEL by increasing the initial selection value SEL0 or the previous selection value SEL by the unit increase value or decreasing the initial selection value SEL0 or the previous selection value SEL by the unit decrease value, based on the up signal UP or the down signal DN provided from the phase detector 130.

When the phase of the delay signal DLLd is equal to the phase of the second pulse signal DLLs, the control logic 140 may determine that the DLL circuit 100 is in a lock state. According to an aspect of an exemplary embodiment, when the signal that the control logic 140 receives changes from the down signal DN to the up signal UP, or vice versa (e.g., the control logic 140 receives the down signal DN after the control logic 140 receives the up signal UP from the phase detector 130, or when the control logic 140 receives the up signal UP after the control logic 140 receives the down signal DN from the phase detector 130), the control logic 140 may determine that the DLL circuit is in a lock state. However, exemplary embodiments of the present disclosure are not limited thereto. The control logic 140 may determine the lock state by using various methods. When the DLL circuit 100 becomes the lock state, the control logic 140 may generate a lock signal LOCK and output the lock signal LOCK to the external circuit (e.g., the DLL control circuit). According to an aspect of an exemplary embodiment, the DLL circuit 100 may output the selection value SEL corresponding to lock state to the external circuit (e.g., the DLL control circuit or the slave DLL) as the reference selection value.

Figure 2A:
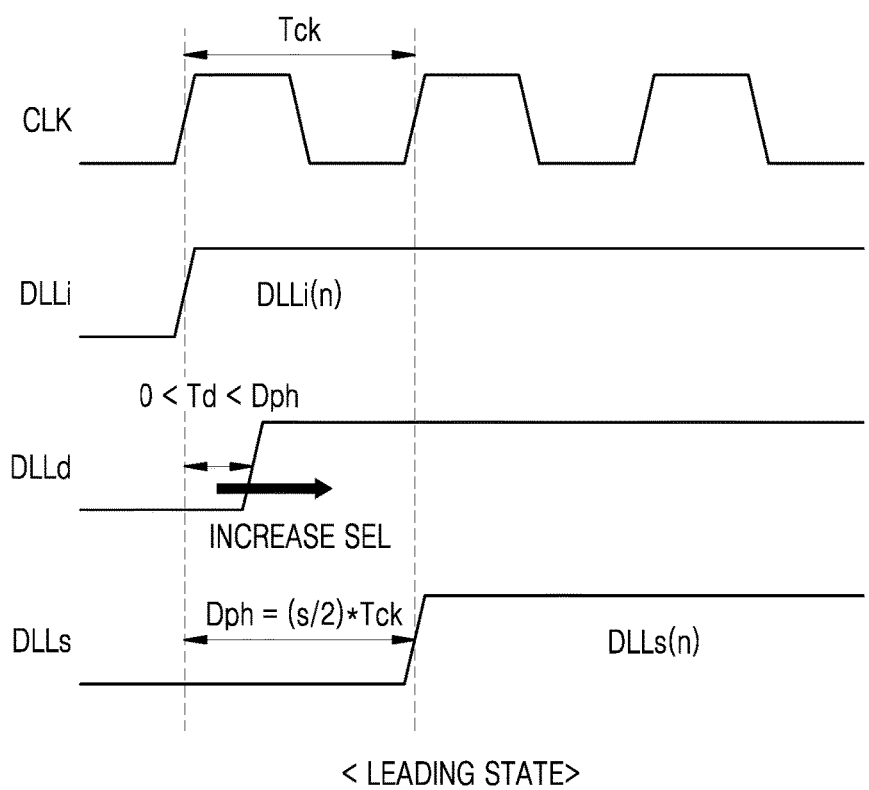
FIGS. 2A to 2C are timing diagrams of a DLL circuit according to an exemplary embodiment.
Figure 2B:
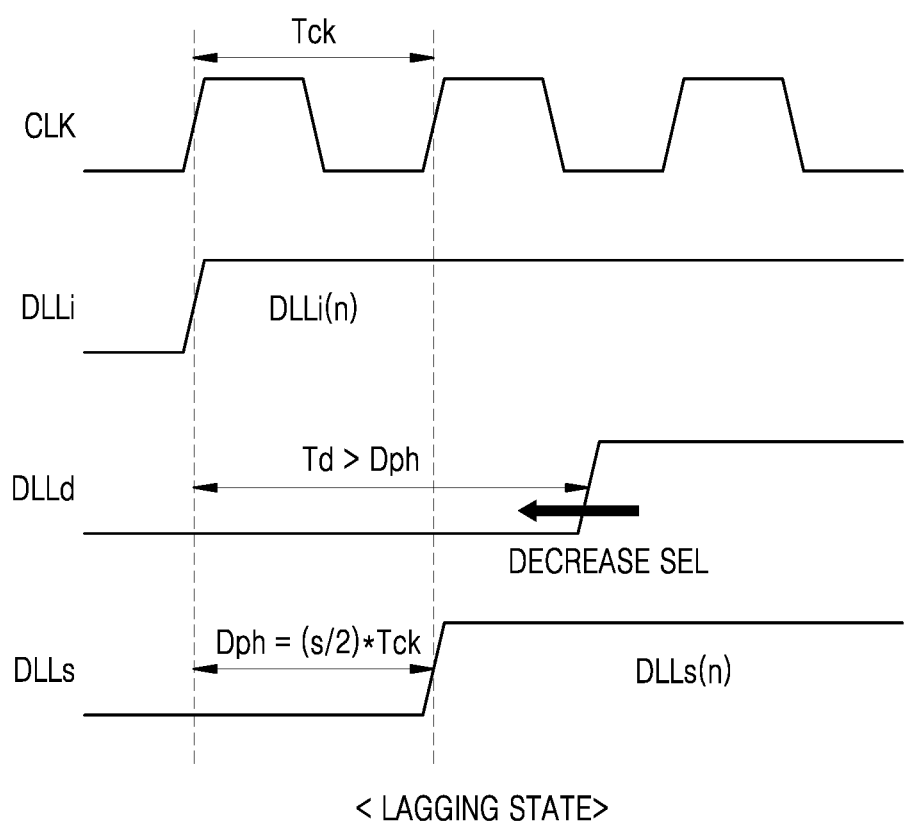
Figure 2C:
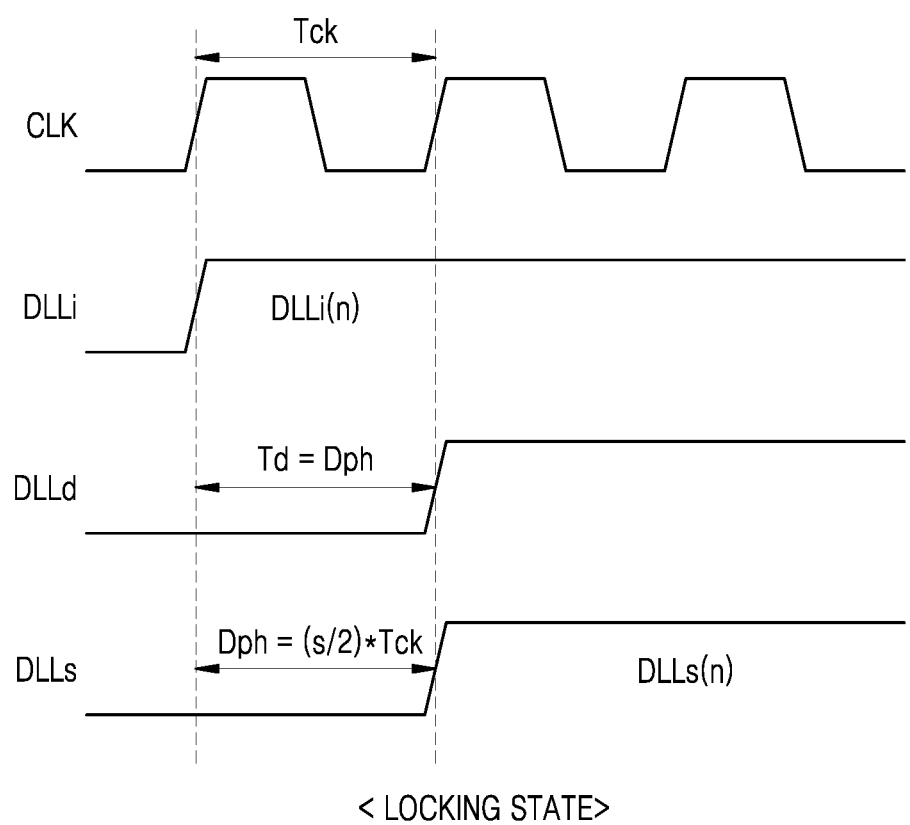

FIGS. 2A to 2C are timing diagrams of the DLL circuit of FIG. 1 according to an exemplary embodiment. FIG. 2A illustrates a leading state in which the delay signal DLLd leads the second pulse signal DLLs, FIG. 2B illustrates a lagging state in which the delay signal DLLd lags behind the second pulse signal DLLs, and FIG. 2C illustrates a lock state in which the delay signal DLLd and the second pulse signal DLLs are in phase.

As shown in FIGS. 2A to 2C, a phase difference Dph between the n-th pulses of the first pulse signal DLLi and the second pulse signal DLLs generated by the pre-processing circuit 110 may be s/2 times the clock period Tck of the clock signal CLK (i.e., (s/2)×Tck). For example, the phase difference Dph may be equal to the clock period Tck of the clock signal CLK. The delay line 120 may generate the delay signal DLLd by delaying the first pulse signal DLLi by a delay amount Td. The phase detector 130 may detect the level of the delay signal DLLd in response to an edge (e.g., rising edge) of the second pulse signal DLLs.

As illustrated in FIG. 2A, when the delay amount Td is smaller than the phase difference Dph between the first pulse signal DLLi and the second pulse signal DLLs, the level of the delay signal DLLd may be detected as being logic high at the rising edge of the second pulse signal DLLs. The control logic 140 may increase the delay amount Td by increasing the selection value SEL. Accordingly, the phase of the delay signal DLLd may lag behind by a larger amount than before the increasing of the selection value SEL. Hereinafter, the increasing of the selection value SEL and the increasing of the delay amount Td may have the same meaning.

As illustrated in FIG. 2B, when the delay amount Td is larger than the phase difference Dph between the first pulse signal DLLi and the second pulse signal DLLs, the level of the delay signal DLLd may be detected as being logic low at the rising edge of the second pulse signal DLLs. The control logic 140 may decrease the delay amount Td by decreasing the selection value SEL. Accordingly, the phase of the delay signal DLLd may be more advanced than before the decreasing of the selection value SEL. Hereinafter, the decreasing of the selection value SEL and the decreasing of the delay amount Td may have the same meaning.

As illustrated in FIG. 2C, the control logic 140 adjusts the selection value SEL, based on the detected phase difference, to detect a lock state, in which the delay amount Td is equal to the phase difference Dph between the first pulse signal DLLi and the second pulse signal DLLs, and the selection value SEL corresponds to the lock state.

As shown in FIG. 1, the operations of the delay line 120, the phase detector 130, and the control logic 140 may constitute a control loop of the DLL circuit 100. An operating period of the control loop (hereinafter, referred to as a control loop period) may be an integer (e.g., 2 or greater) multiple of the clock period Tck. The control loop may be repeatedly performed until the DLL circuit 100 is in the lock state.

The time period that begins when the delay line 120 delays and outputs an n-th pulse of the first pulse signal DLLi (where n is a natural number) based on the selection value SEL and ends when the delay line 120 delays and outputs an (n+1)-th pulse of the first pulse signal DLLi based on the adjusted selection value SEL may be equal to the control loop period. Also, the phase detector 130 may detect the phase difference at each control loop period. Accordingly, the period of the first pulse signal DLLi and the period of the second pulse signal DLLs may be equal to the control loop period.

Figure 3:
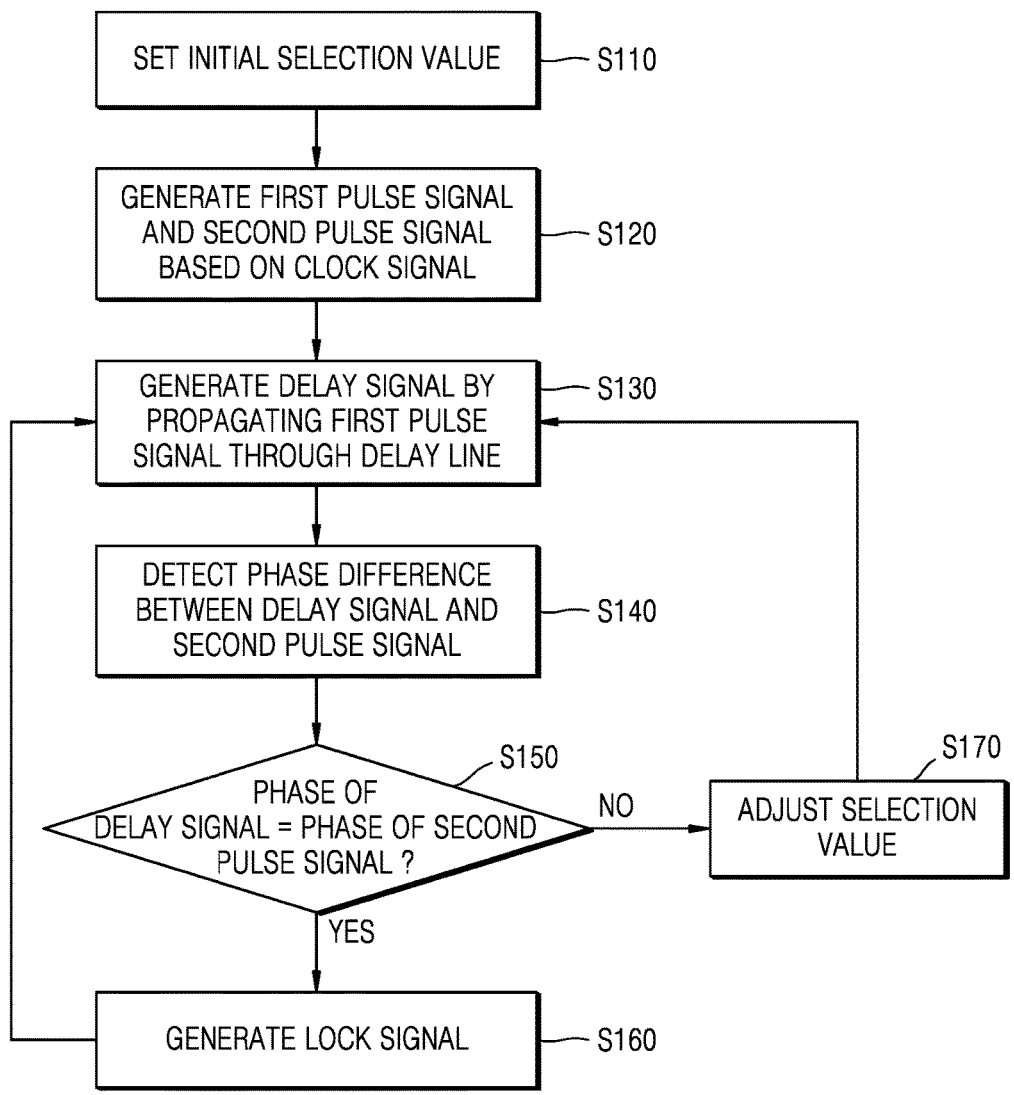
FIG. 3 is a flowchart of an operating method of a DLL circuit, according to an exemplary embodiment.

FIG. 3 is a flowchart of an operating method of a DLL circuit, according to an exemplary embodiment.

The operating method of FIG. 3 may be performed by the DLL circuit 100 of FIG. 1. The description provided with reference to FIG. 1 may be applied to the operating method of FIG. 3.

In operation S110, the DLL circuit may set an initial selection value. For example, a control logic (e.g., control logic 140 of FIG. 1) may set the initial selection value based on a control signal. An initial delay amount of a delay line included in the DLL circuit may be set based on the initial selection value.

In operation S120, the DLL circuit may generate a first pulse signal and a second pulse signal based on a clock signal. The clock signal may be provided from an external circuit, and a pre-processing circuit (e.g., pre-processing circuit 110 of FIG. 1) may pre-process the clock signal to generate the first pulse signal and the second pulse signal. A phase of the first pulse signal may lead a phase of the second pulse signal, and a phase difference between the first pulse signal and the second pulse signal may be s/2 times the clock period Tck of the clock signal (where s is a positive integer). Operation S120 may be repeatedly performed during the operation of the DLL circuit.

Thereafter, a control loop operation may be performed. In operation S130, the DLL circuit generates a delay signal by propagating the first pulse signal through the delay line (e.g., delay line 120 of FIG. 1). The delay line may delay the first pulse signal by a delay amount set according to the initial selection value and output the delay signal. Thereafter, when the selection value is changed, the delay line may delay the first pulse signal by a delay amount set according to the changed selection value, and output the delay signal.

In operation S140, the DLL circuit may detect a phase difference between the delay signal and the second pulse signal. In other words, the DLL circuit may compare a delay amount Td of a delay circuit with a phase difference (s/2)×Tck between the first pulse signal and the second pulse signal. A phase detector (e.g., phase detector 130 of FIG. 1) included in the DLL circuit may detect the phase difference by sampling the level of the delay signal at a rising edge or a falling edge of the second pulse signal. When the level of the delay signal is logic high, the phase detector may determine that the delay amount Td is smaller than the phase difference (s/2)×Tck and output an up signal UP indicating an instruction to increase the delay amount Td. When the level of the delay signal is logic low, the phase detector may determine that the delay amount Td is larger than the phase difference (s/2)×Tck and output a down signal DN indicating an instruction to decrease the delay amount Td.

In operation S150, the DLL circuit may determine whether a phase of the delay signal is equal (i.e., congruent) to a phase of the second pulse signal, based on a result of the detecting. In operation S160, when the phase of the delay signal is equal to the phase of the second pulse signal, the DLL circuit may determine a current state as a lock state and generate a lock signal. In operation S170, when the phase of the delay signal is not equal to the phase of the second pulse signal, the DLL circuit may adjust the selection value so that the phase of the delay signal is equal to the phase of the second pulse signal.

For example, the control logic may determine whether the phase of the delay signal is equal to the phase of the second pulse signal (i.e., whether the DLL circuit becomes a lock state) based on the output signal of the phase detector. When the control logic determines that the phase of the delay signal is equal to the phase of the second pulse signal, the control logic may generate the lock signal. When the control logic determines that the phase of the delay signal is not equal to the phase of the second pulse signal, the control logic may increase or decrease the selection value.

When the selection value is adjusted, operation S140 of generating the delay signal according to the adjusted selection value may be performed again. Operations S130, S140, S150, and S170 may constitute a control loop. The control loop may be repeatedly performed until the DLL circuit becomes a lock state. Also, even after the DLL circuit becomes a lock state, the clock signal may change according to PVT variations. In this case, a lock state and a selection value corresponding the lock state need to be detected and adjusted again. Thus, the control loop may be continuously performed even after the DLL circuit becomes a lock state.

As described above, the control loop period may be an integer (e.g., 2 or greater) multiple of the clock period (Tck). The setting of the control loop period may be performed at substantially the same time as operation S110 of setting the initial selection value. For example, the control logic may set the control loop period based on the control signal.

Figure 4:
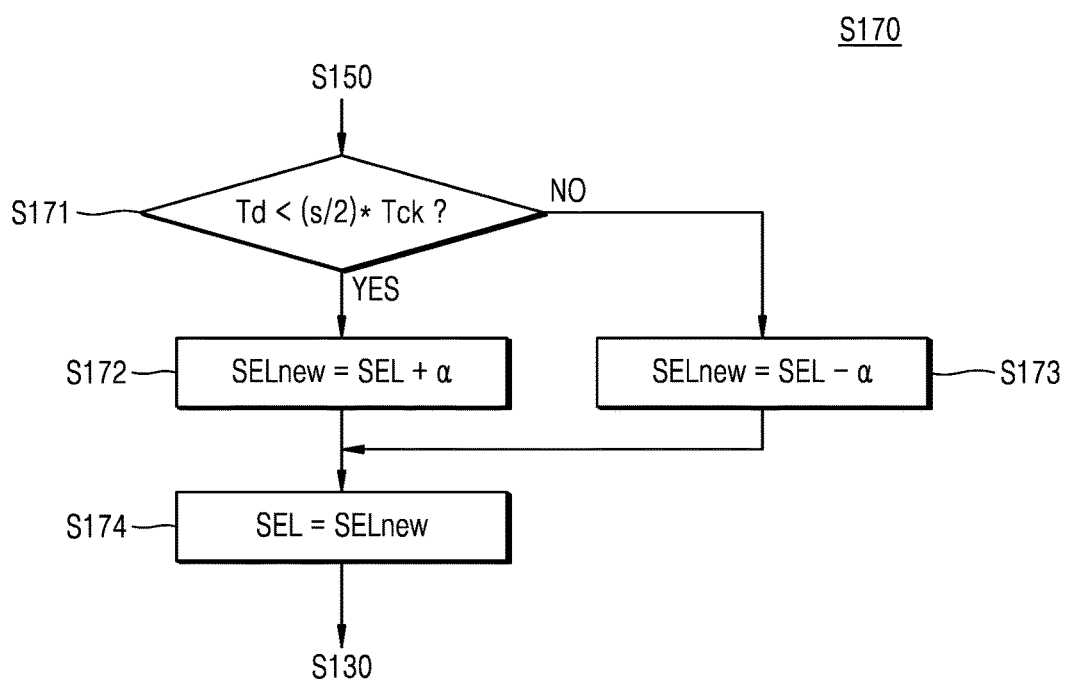
FIG. 4 is a flowchart of operation of adjusting a selection value in FIG. 3.

FIG. 4 is a flowchart of operation S170 of adjusting the selection value in FIG. 3.

Referring to FIG. 4, in operation S171, when the phase of the delay signal is not equal to the phase of the second pulse signal, the DLL circuit may determine whether the delay amount Td is smaller than (s/2)×Tck. For example, when the output signal of the phase detector is the up signal UP, the control logic may determine that the delay amount Td is smaller than (s/2)×Tck, and when the output signal of the phase detector is the down signal DN, the control logic may determine that the delay amount Td is larger than (s/2)×Tck.

In operation S172, when the delay amount Td is smaller than (s/2)×Tck, the DLL circuit may generate a new selection value SELnew by adding a unit increase value α to the selection value SEL. In operation S173, when the delay amount Td is equal to or larger than (s/2)×Tck, the DLL circuit may generate the new selection value SELnew by subtracting a unit decrease value α from the selection value SEL. It is assumed in FIG. 4 that the unit increase value is equal to the unit decrease value, but embodiments of the inventive concept are not limited thereto. The unit increase value may be different from the unit decrease value. For example, the new selection value SELnew may be generated by subtracting a unit decrease value β from the selection value SEL, where the value β is different from the value α.

In operation S174, the DLL circuit may set the new selection value SELnew as the selection value SEL. The new selection value SELnew (i.e., value SEL) may be output to the delay line. In this manner, the selection value may be adjusted according to a result of detecting the phase difference between the delay signal and the second pulse signal.

Figure 5A:
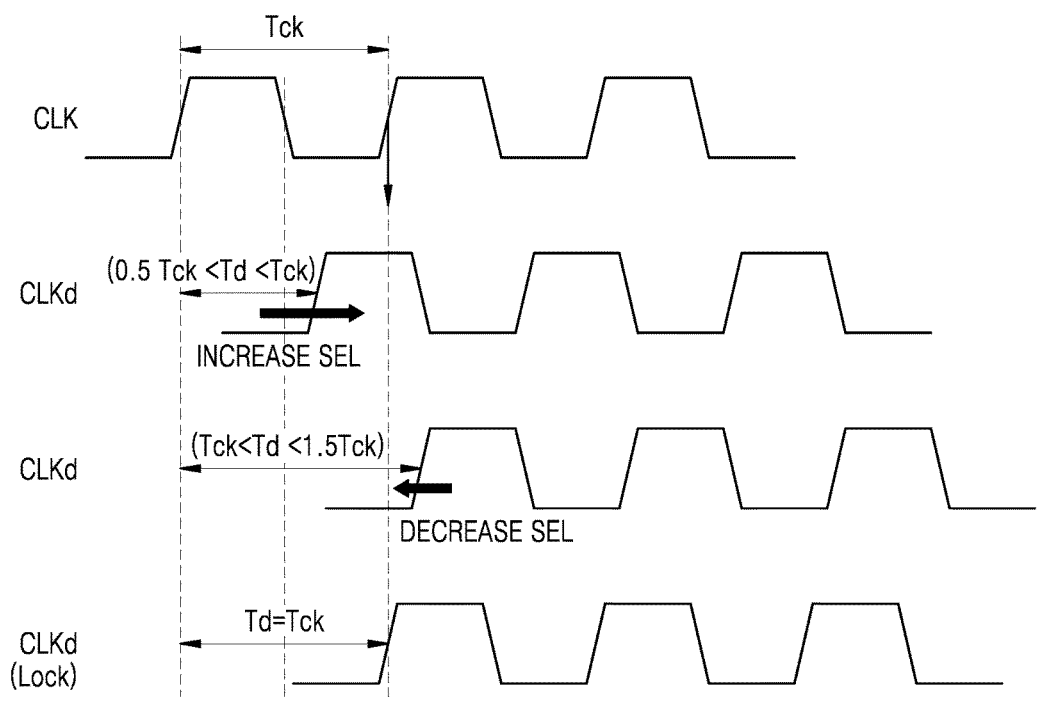
FIGS. 5A to 5C are timing diagrams for describing an operation of a DLL circuit according to a comparative example.
Figure 5B:
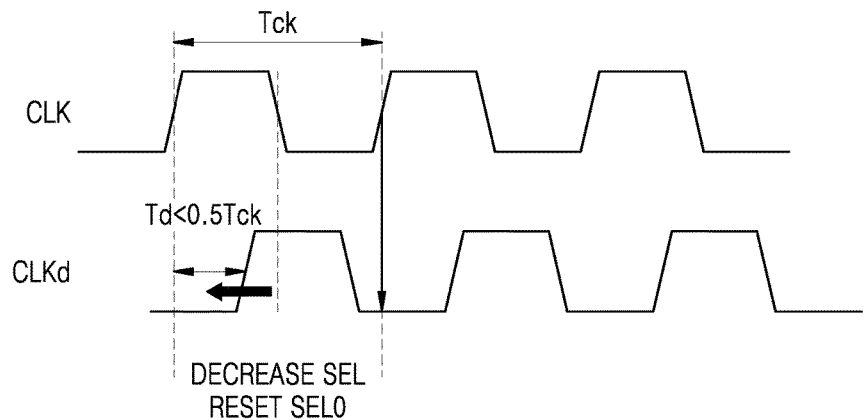
Figure 5C:
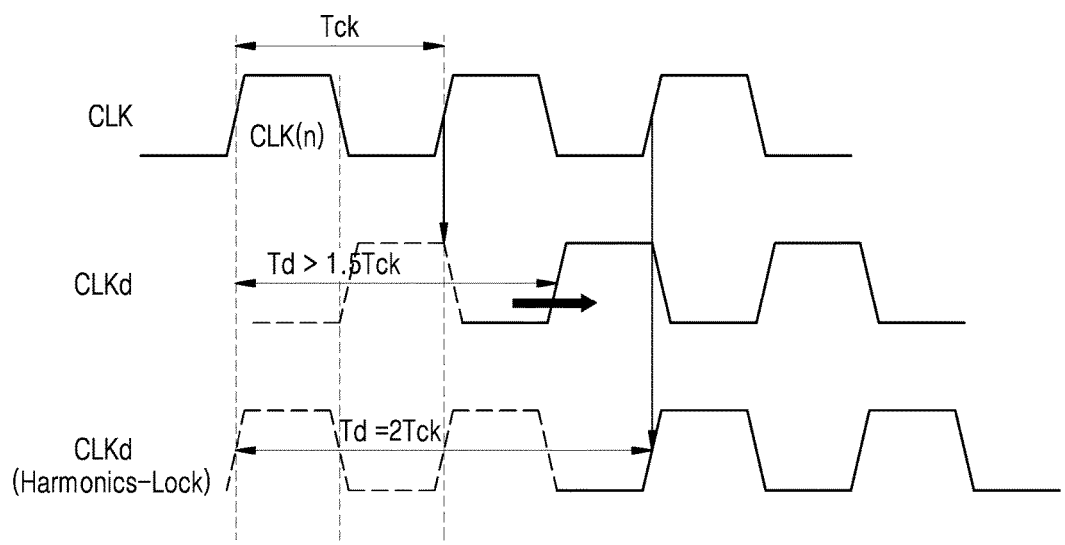

FIGS. 5A to 5C are timing diagrams of a DLL circuit according to a comparative example. FIGS. 5A to 5C are illustrated for comparison with FIGS. 2A-2C for clear understanding of the DLL circuit (e.g., DLL circuit 100 of FIG. 1) according to an exemplary embodiment and are not intended to limit the scope of the present disclosure.

As described above, the DLL circuit 100 may detect the lock state and the selection value SEL corresponding to the lock state, based on the first pulse signal DLLi and the second pulse signal DLLs generated based on the clock signal CLK. Unlike the DLL circuit 100, the DLL circuit according to the comparative example may detect the selection value SEL corresponding to the lock state based on the clock signal CLK. The DLL circuit according to the comparative example may delay the clock signal CLK through the delay line to generate a delayed clock signal CLKd. As illustrated in FIGS. 5A to 5C, the DLL circuit according to the comparative example may detect the selection value SEL, at which the DLL circuit becomes a lock state, by comparing a phase of the clock signal CLK with a phase of the delayed clock signal CLKd and setting the selection value so that a delay amount Td of the delay line corresponds to Tck, based on a result of the comparing. For example, when the level of the delayed clock signal CLKd sampled at a rising edge of the clock signal CLK is logic high, the DLL circuit may increase the selection value SEL, and when the level of the delayed clock signal CLKd is logic low, the DLL circuit may decrease the selection value SEL.

In the DLL circuit according to the comparative example of FIG. 5A, when the delay amount Td of the delay line based on the initial selection value SEL0, that is, the initial value of the selection value SEL, is larger than 0.5×Tck and smaller than 1.5×Tck, the control logic may detect the selection value SEL, at which the DLL circuit becomes a lock state, by increasing or decreasing the selection value SEL. When the DLL circuit according to the comparative example becomes a lock state, the clock signal CLK and the delayed clock signal CLKd have a phase difference of one clock period Tck.

However, as illustrated in FIG. 5B, when the delay amount Td of the delay line based on the initial selection value SEL0 is set to be smaller than 0.5×Tck, the control logic decreases the selection value SEL. Accordingly, an exceptional example in which the selection value SEL approaches a minimum value may occur. When the selection value SEL approaches the minimum value, the control logic included in the DLL circuit detects that the selection value SEL approached the minimum value, and resets the initial selection value SEL0. The control logic may increase the initial selection value SEL0 so that the delay amount Td is larger than 0.5×Tck. Thereafter, the DLL circuit needs to repeat the process of detecting the selection value SEL corresponding to the lock state based on the reset initial selection value SEL0. Consequently, the complexity of the control logic increases and it takes a longer time until the DLL circuit becomes the lock state.

Also, as illustrated in FIG. 5C, when the delay amount Td of the delay line based on the initial selection value SEL0 is set to be larger than 1.5×Tck, the control logic increases the selection value SEL. Accordingly, the DLL circuit may enter an unintended harmonic lock state. The DLL circuit according to the comparative example becomes the lock state in which the clock signal CLK and the delayed clock signal CLKd have a phase difference of two or more clock periods. Consequently, the DLL circuit may perform an incorrect operation.

However, as described above with reference to FIG. 1, the DLL circuit 100 according to an exemplary embodiment of the present disclosure detects the selection value SEL corresponding to the lock state, based on the first pulse signal DLLi and the second pulse signal DLLs generated based on the clock signal CLK. In this case, the DLL circuit 100 detects the lock state by comparing the delay signal DLLd with the second pulse signal DLLs, the phase of which lags behind the phase of the first pulse signal DLLi by (s/2)×Tck. Thus, even when the delay amount Td based on the initial selection value SEL0 is set to be very small, for example, smaller than 0.5×Tck, the control logic 140 may increase the selection value SEL and detect the lock state and the selection value SEL corresponding to the lock state, as illustrated in FIG. 2A. Therefore, the control logic 140 may be simplified and the time necessary to detect the lock state may be reduced.

Also, since the period of the second pulse signal DLLs corresponds to an integer multiple of the clock period Tck (e.g., an integer is 2 or greater), the control logic 140 may decrease the selection value SEL even when the delay amount Td based on the initial selection value SEL0 is set to be very large (e.g., larger than 1.5×Tck), as illustrated in FIG. 2B. Accordingly, it is possible to prevent an unintended harmonic lock state from occurring. In this case, as long as the delay amount Td is smaller than an amount calculated by subtracting a pulse width of the first pulse signal DLLi from the control loop period, it is possible to prevent an unintended harmonic lock state from occurring. Also, since the period of the first pulse signal DLLi input to the delay line 120 is longer than the period of the clock signal CLK and is substantially equal to the control loop period, dynamic power consumption of the delay line 120 may be reduced.

As described above, in the DLL circuit 100 according to an exemplary embodiment, the control logic 140 may be simplified and the lock state may be quickly detected. Also, it is possible to prevent an unintended harmonic lock state from occurring.

Figure 6:
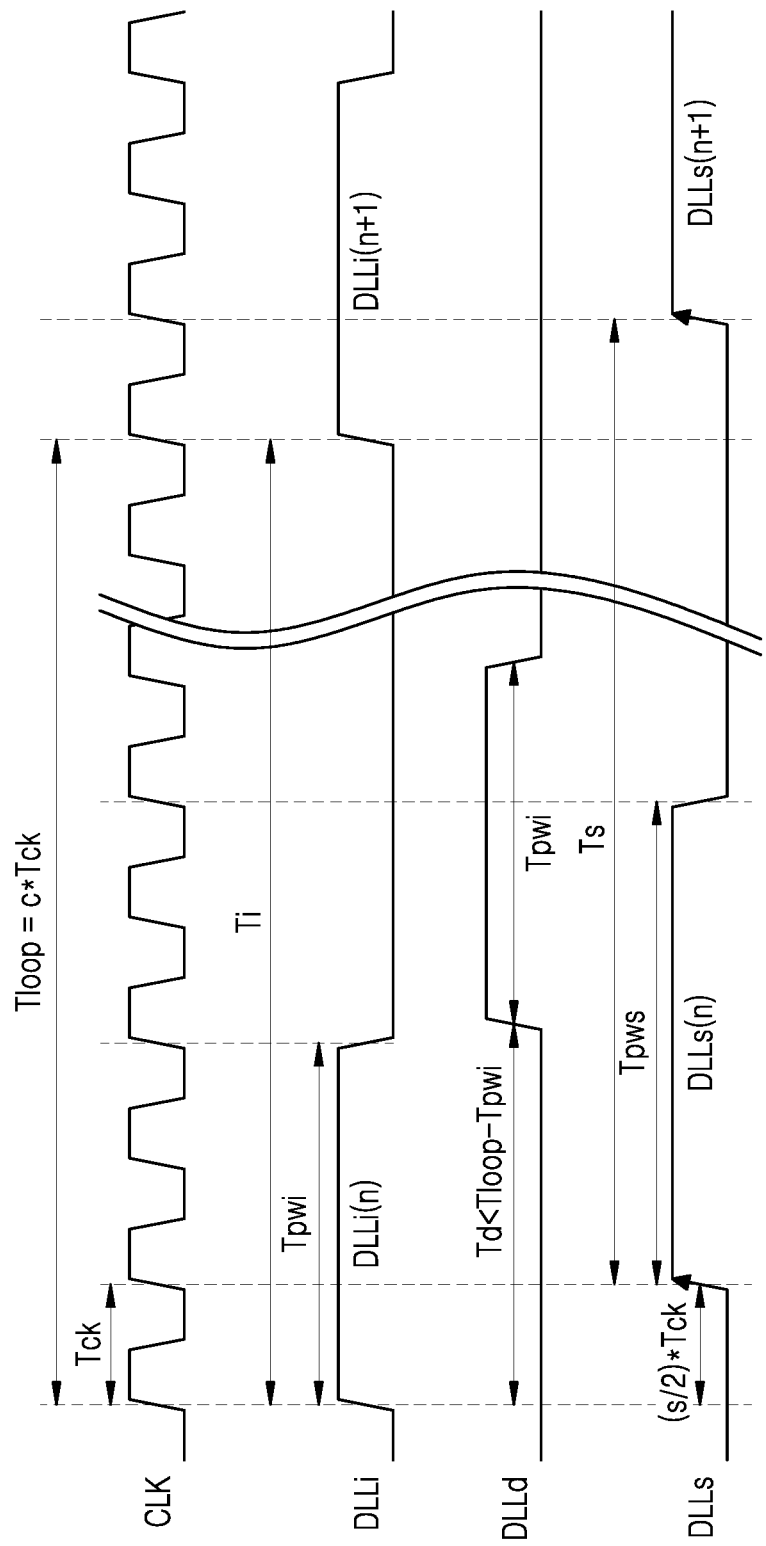
FIG. 6 is a timing diagram for describing an operation of a DLL circuit according to an exemplary embodiment in more detail.

FIG. 6 is a timing diagram for describing the operation of the DLL circuit according to an exemplary embodiment in more detail.

In FIG. 6, the control loop period Tloop may be c times the clock period Tck of the clock signal CLK, that is, c×Tck (where c is a positive integer of 2 or greater). The period Ti of the first pulse signal DLLi and the period Ts of the second pulse signal DLLs may be set based on the control loop period Tloop. For example, the period Ti of the first pulse signal DLLi and the period Ts of the second pulse signal DLLs may be set to be equal to the control loop period Tloop.

The first pulse signal DLLi and the second pulse signal DLLs may be synchronized with the clock signal CLK. In other words, the rising edges and the falling edges of the first pulse signal DLLi and the second pulse signal DLLs may be synchronized with the rising edge or the falling edge of the clock signal CLK. For example, the rising edges of the first pulse signal DLLi and the second pulse signal DLLs may be synchronized with the rising edge of the clock signal CLK. In another example, the rising edge and the falling edge of the first pulse signal DLLi may be synchronized with the rising edge of the clock signal CLK, and the rising edge and the falling edge of the second pulse signal DLLs may be synchronized with the falling edge of the clock signal CLK. However, exemplary embodiments are not limited thereto, and other examples may also be applied thereto.

The second pulse signal DLLs may be synchronized with the clock signal CLK after half or more clock period of the first pulse signal DLLi. Accordingly, the phase of the second pulse signal DLLs may lag behind the phase of the first pulse signal DLLi. In other words, a time point when a rising edge of an n-th pulse of the second pulse signal DLLs is generated may be later than a time point when a rising edge of an n-th pulse of the first pulse signal DLLi is generated. A phase difference between the first pulse signal DLLi and the second pulse signal DLLs may be (s/2)×Tck. The phase difference between the first pulse signal DLLi and the second pulse signal DLLs may be less than or equal to the control loop period Tloop.

A pulse width Tpwi of the first pulse signal DLLi and a pulse width Tpws of the second pulse signal DLLs may be an integer multiple of the clock period Tck and may be less than the control loop period Tloop. The pulse width Tpws of the second pulse signal DLLs may be equal to or different from the pulse width Tpwi of the first pulse signal DLLi.

Since the delay signal DLLd is generated by delaying the first pulse signal DLLi by the delay amount of the delay line (delay line 120 of FIG. 1), signal characteristics of the delay signal DLLd may be substantially the same as signal characteristics of the first pulse signal DLLi. For example, the period and the pulse width of the delay signal DLLd are equal to the period Ti and the pulse width Tpwi of the first pulse signal DLLi. However, the phase of the delay signal DLLd may lag behind the phase of the first pulse signal DLLi by the delay amount Td.

A lock state occurs when the delay amount Td is equal to (s/2)×Tck, that is, the phase difference between the first pulse signal DLLi and the second pulse signal DLLs. Accordingly, when the DLL circuit determines that the delay amount Td is smaller than (s/2)×Tck, the DLL circuit may increase the delay amount Td, that is, the selection value. When the DLL circuit determines that the delay amount Td is larger than (s/2)×Tck, the DLL circuit may decrease the delay amount Td, that is, the selection value. For example, when the delay amount Td is determined to be smaller than (s/2)×Tck in a current control loop, the delay amount Td may be increased in a next control loop. The increase in the delay amount Td may be proportional to the unit increase value of the selection value.

As long as the delay amount Td based on an initial selection value (hereinafter, referred to as an initial delay amount) is set to be smaller than an amount calculated by subtracting the pulse width Tpwi from the control loop period Tloop, it is possible to prevent an unintended harmonic lock from occurring, regardless of the amount of the phase difference between the first pulse signal DLLi and the second pulse signal DLLs. Also, an increase in the phase difference between the first pulse signal DLLi and the second pulse signal DLLs may cause an increase in a maximum value of the initial delay amount Td satisfying a condition that prevents an unintended harmonic lock from occurring.

Figure 7A:
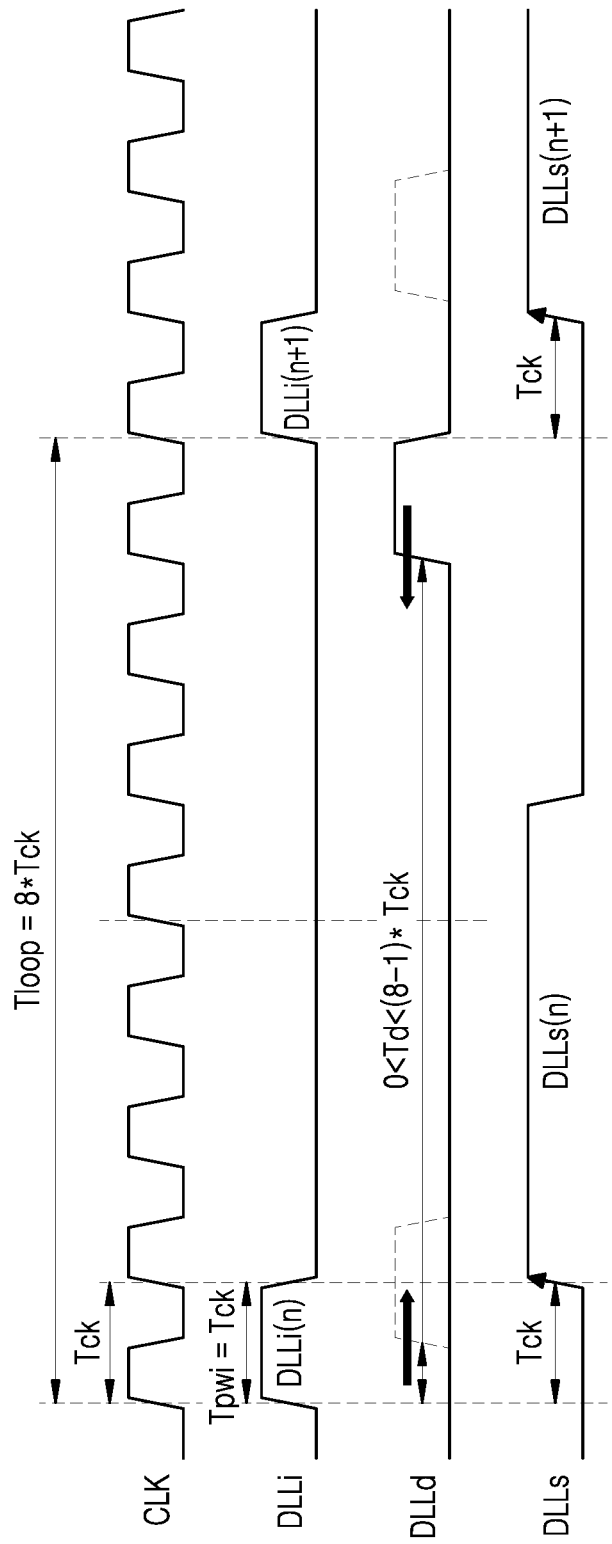
FIGS. 7A and 7B are timing diagrams for describing operations of a DLL circuit, according to an exemplary embodiment.
Figure 7B:
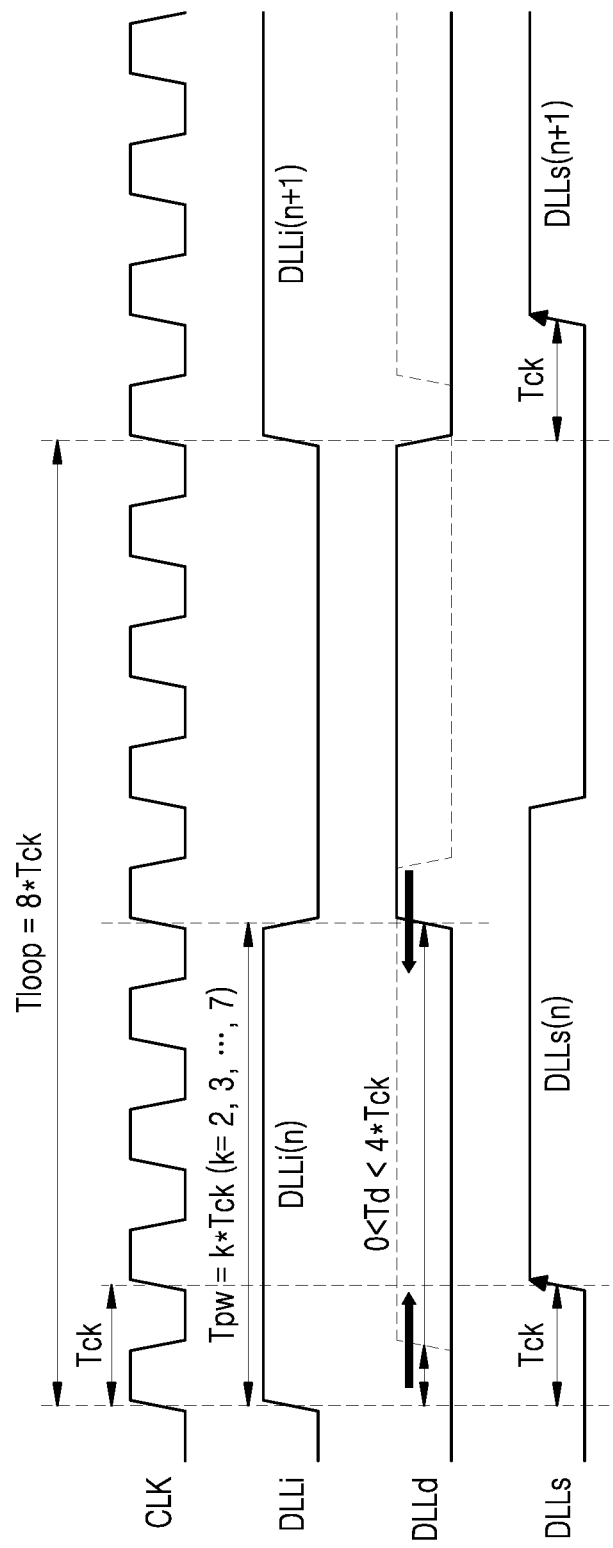

FIGS. 7A and 7B are timing diagrams for describing operations of the DLL circuit according to an exemplary embodiment. Specifically, FIGS. 7A and 7B illustrate the setting of the pulse width Tpwi of the first pulse signal DLLi. For convenience of description, it is assumed that the control loop period Tloop is 8×Tck and the phase difference between the first pulse signal DLLi and the second pulse signal DLLs is one clock period Tck. However, the values of the control loop period Tloop and the phrase difference are not limited thereto.

When the delay amount Td is smaller than the phase difference between the first pulse signal DLLi and the second pulse signal DLLs, that is, one clock period Tck, the DLL circuit may operate to increase the selection value, and when the delay amount Td is larger than one clock period Tck, the DLL circuit may operate to decrease the selection value.

Referring to FIG. 7A, the pulse width Tpwi of the first pulse signal DLLi may be set to be one clock period Tck. As described above with reference to FIG. 6, when the initial delay amount Td is set to be smaller than an amount calculated by subtracting the pulse width Tpwi from the control loop period Tloop, that is, 7×Tck (=8×Tck−Tck), it is possible to prevent an unintended harmonic lock from occurring. The small pulse width Tpwi may cause an increase in the maximum value of the initial delay amount Td satisfying a condition that prevents an unintended harmonic lock from occurring. In other words, a range of the initial delay amount Td satisfying a condition in which the DLL circuit can normally detect the lock state may be wide.

Referring to FIG. 7B, the pulse width Tpwi of the first pulse signal DLLi may be set to be an integer (e.g., 2 or greater) multiple of the clock period Tck. For example, the pulse width Tpwi may be set to be twice to seven times the clock period Tck. The wider pulse width Tpwi of the first pulse signal DLLi may further reduce an influence caused by a duty distortion of the unit delay cell UD of the delay line (e.g., delay line 120 of FIG. 1). Accordingly, as the pulse width Tpwi of the first pulse signal DLLi is wider, a more stable delay signal DLLd may be generated.

As described above with reference to FIG. 7B, in a case where the pulse width Tpwi is set to be four times the clock period Tck, if the initial delay amount Td is set to be smaller than 4×Tck (=8×Tck−4×Tck), it is possible prevent an unintended harmonic lock from occurring.

Figure 8B:
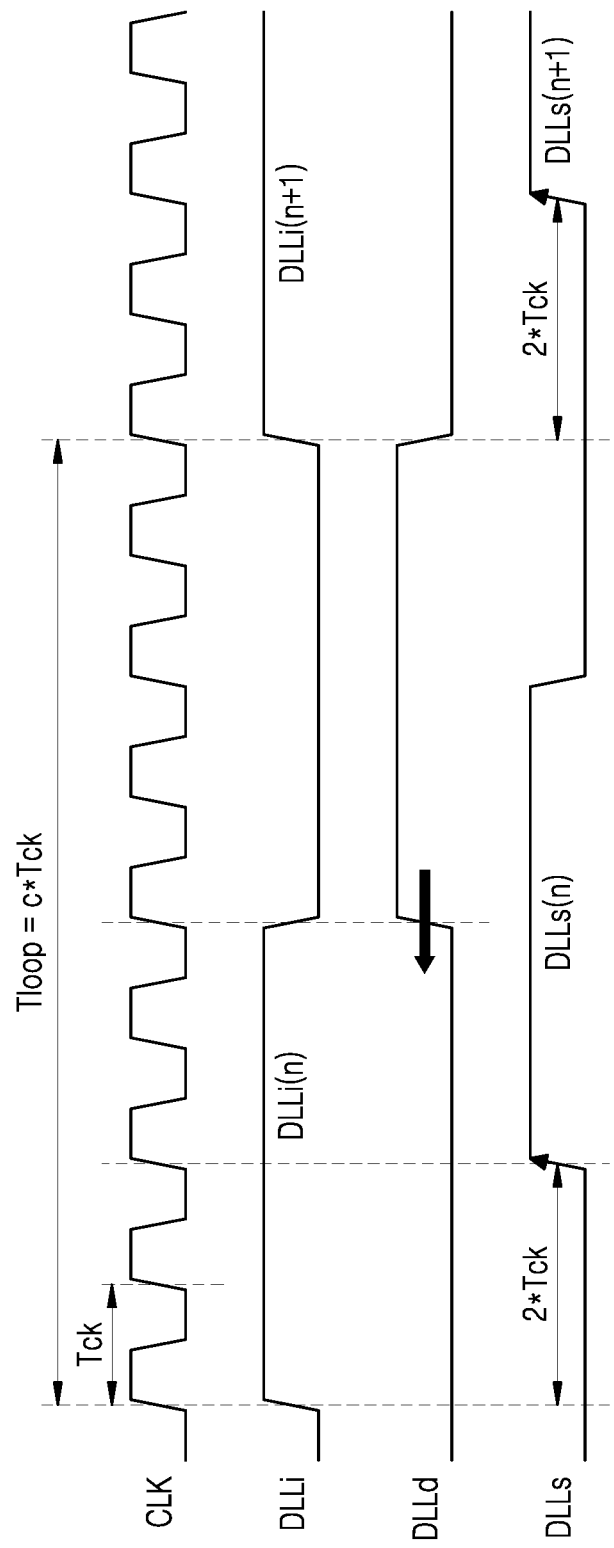
Figure 8C:
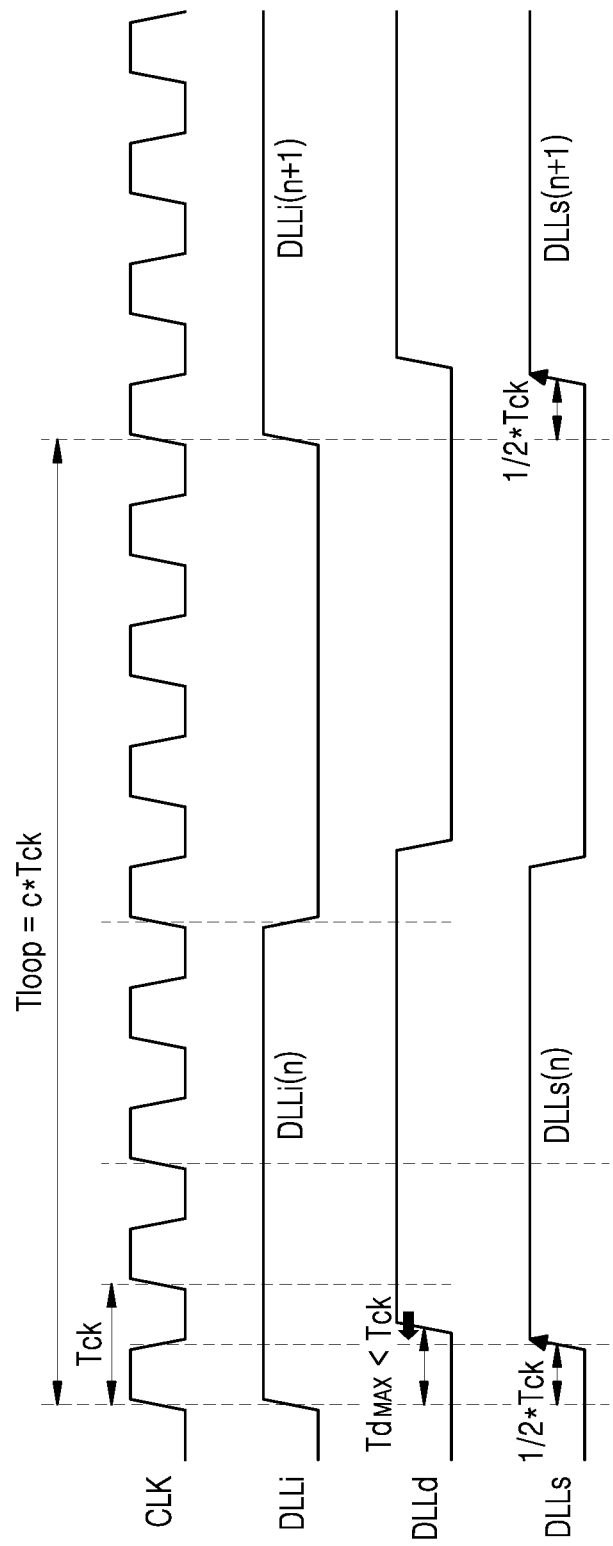

FIGS. 8A to 8C are timing diagrams for describing operations of the DLL circuit, according to an exemplary embodiment. Specifically, FIGS. 8A to 8C illustrate the setting of the phase difference between the first pulse signal DLLi and the second pulse signal DLLs, according to various exemplary embodiments.

In FIG. 8A, the phase difference between the first pulse signal DLLi and the second pulse signal DLLs may be set to be one clock period Tck. As described above, the DLL circuit may be determined to be in the lock state when the delay amount Td is equal to the phase difference between the first pulse signal DLLi and the second pulse signal DLLs. Accordingly, when the delay amount Td is equal to one clock period Tck, it may be determined as the lock state. A selection value corresponding to the lock state, that is, a selection value when the delay amount Td is equal to one clock period Tck, may be detected. However, due to an error of the phase detector (e.g., phase detector 130 of FIG. 1), a routing mismatch, or the like, an error element Terror (also referred to as $T_{error}$) may be generated. In practice, it may be determined as the lock state when a value Td+Terror in which the error element Terror is added to the delay amount Td is equal to one clock period Tck. In the lock state, the delay amount Td may be represented by Tck−Terror, and the selection value in the lock state may correspond to one clock period Tck and the error element Terror. Accordingly, in practice, the selection value corresponding to one clock period Tck may include an error value based on the error element Terror.

Referring to FIG. 8B, the phase difference between the first pulse signal DLLi and the second pulse signal DLLs may be set to be two clock periods 2×Tck. In this case, the DLL circuit may intentionally detect a harmonic lock with a harmonic factor of 2. When the delay amount Td is equal to two clock periods 2×Tck, it may be determined as the lock state (i.e., intended harmonic lock state). A selection value corresponding to the lock state, that is, a selection value when the delay amount Td is equal to two clock periods 2×Tck, may be detected.

In practice, as described above with reference to FIG. 8A, it may be determined as a lock state when a value Td+Terror in which an error element Terror is added to the delay amount Td is equal to two clock periods 2×Tck. In the lock state, the delay amount Td may be represented by 2×Tck−Terror, and the selection value in the lock state may correspond to two clock periods 2×Tck and the error element Terror. A delay amount Td' corresponding to one clock period Tck without taking into account the error element Terror is an amount calculated by dividing the delay amount corresponding to the lock state by the harmonic factor, that is, 2. In practice, the delay amount Td' corresponding to one clock period Tck is Tck−Terror/2. Accordingly, a value corresponding to one clock period Tck, that is, a value obtained by dividing the selection value corresponding to the lock state by 2 (i.e., harmonic factor) may include an error value based on ½ of the error element Terror.

When the phase difference between the first pulse signal DLLi and the second pulse signal DLLs is (s/2)×Tck, the selection value corresponding to one clock period Tck may include 1/s times the error element Terror (e.g., Terror/2).

As such, in a case where the phase difference between the first pulse signal DLLi and the second pulse signal DLLs is set to be larger than one clock period Tck, that is, in a case where the DLL circuit intentionally detects the harmonic lock, a value corresponding to one clock period, that is, a value obtained by dividing the selection value corresponding to the lock state by the harmonic factor, may include less error element Terror, as compared with a case where the phase difference between the first pulse signal DLLi and the second pulse signal DLLs is set to be one clock period Tck, that is, in a case where the DLL circuit detects one clock period Tck.

In FIG. 8C, the phase difference between the first pulse signal DLLi and the second pulse signal DLLs may be set to be a half clock period (½)×Tck. The first pulse signal DLLi may be synchronized with a rising edge of the clock signal CLK, and the second pulse signal DLLs may be synchronized with a falling edge of the clock signal CLK. However, embodiments of the inventive concept are not limited thereto. The first pulse signal DLLi may be synchronized with a falling edge of the clock signal CLK, and the second pulse signal DLLs may be synchronized with a rising edge of the clock signal CLK.

When the phase difference between the first pulse signal DLLi and the second pulse signal DLLs is set to be the half clock period (½)×Tck, the lock state may be detected even when a maximum delay amount TdMAx of the delay line (e.g., delay line 120 of FIG. 1) is smaller than one clock period Tck of the clock signal CLK. When the maximum delay amount TdMAx is larger than the half clock period (½)×Tck of the clock signal CLK, the lock state may be detected. Thus, the DLL circuit may operate at a low speed based on the limited maximum delay amount TdMAx of the delay line 120, that is, the limited number of unit delay cells.

Figure 9A:
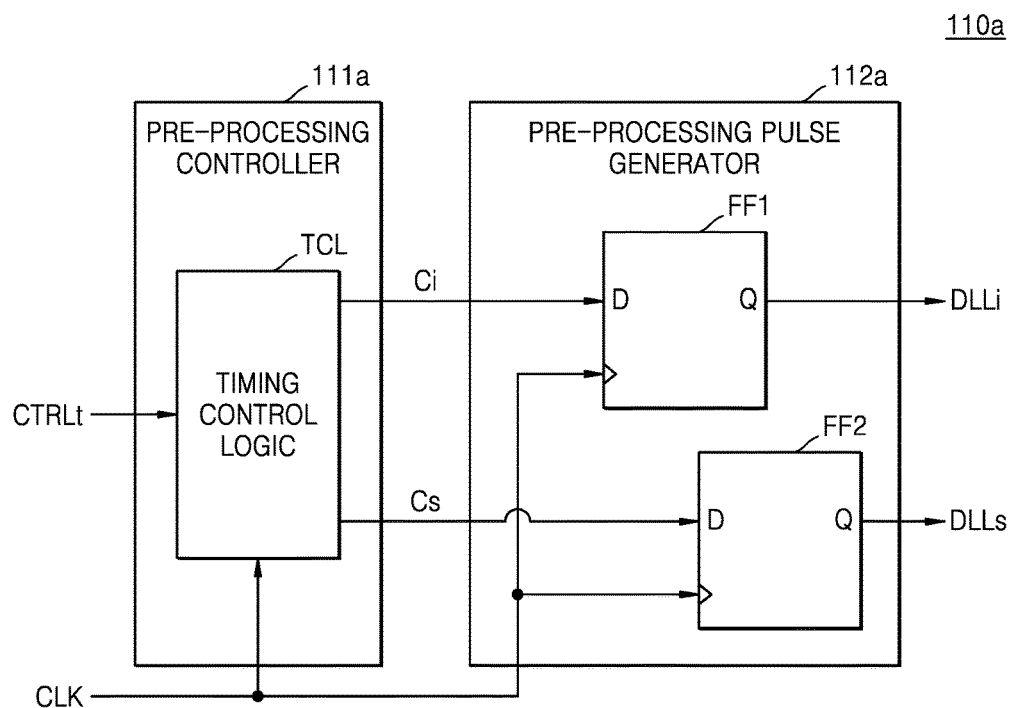
FIG. 9A is a block diagram of a pre-processing circuit of a DLL circuit, according to an exemplary embodiment.
Figure 9B:
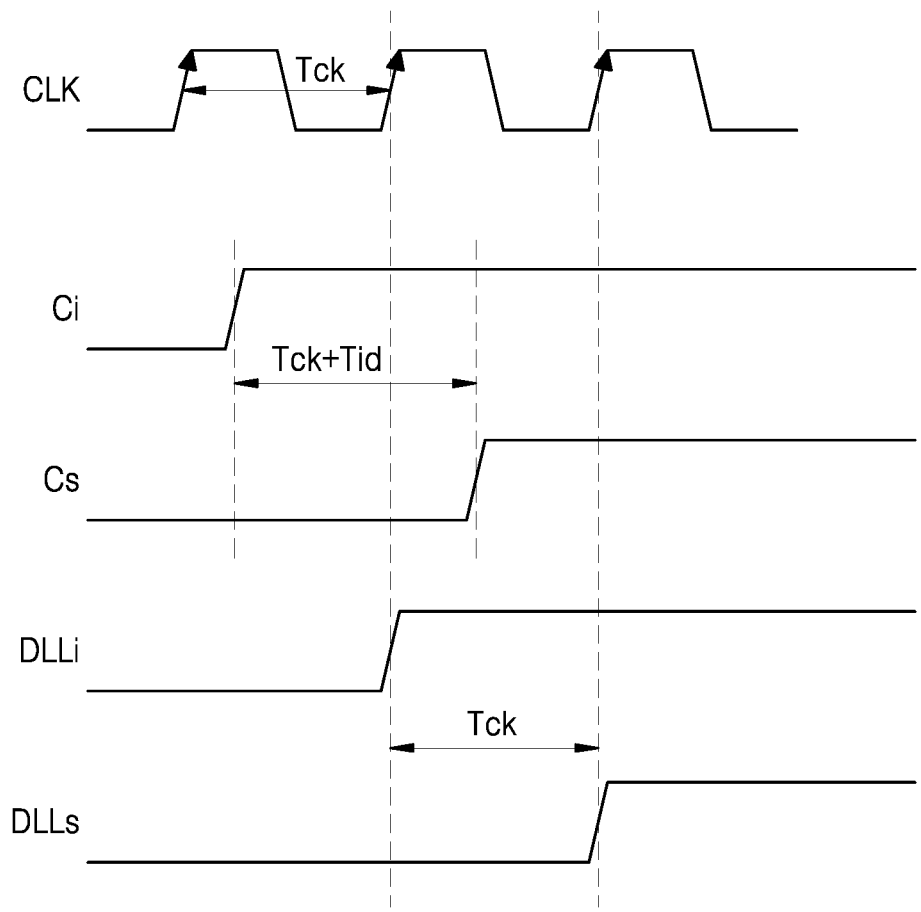
FIG. 9B is a timing diagram for describing an operation of the pre-processing circuit of FIG. 9A according to an exemplary embodiment.

FIG. 9A is a block diagram of a pre-processing circuit 110a of the DLL circuit according to an exemplary embodiment, and FIG. 9B is a timing diagram of the pre-processing circuit 110a.

As shown in FIG. 9A, the pre-processing circuit 110a may include a pre-processing controller 111a and a pre-processing pulse generator 112a.

The pre-processing controller 111a may generate a first pre-pulse signal Ci and a second pre-pulse signal Cs. The pre-processing controller 111a may include a timing control logic TCL. The timing control logic TCL may generate the first pre-pulse signal Ci and the second pre-pulse signal Cs based on a clock signal CLK and a timing control signal CTRLt. For example, the timing control logic TCL may include a counter or a divider. The timing control signal CTRLt controls the counter or the divider based on a reference delay amount or a control loop period set to the DLL circuit (e.g., DLL circuit 100 of FIG. 1), so as to generate the first pre-pulse signal Ci and the second pre-pulse signal Cs. The phase difference between the first pre-pulse signal Ci and the second pre-pulse signal Cs may be set based on one clock period Tck of the clock signal CLK.

As illustrated in FIG. 9B, due to a delay component inside the timing control logic TCL, the first pre-pulse signal Ci and the second pre-pulse signal Cs may not be synchronized with the clock signal CLK. Also, the phase difference between the first pre-pulse signal Ci and the second pre-pulse signal Cs may further include the delay component Tid in addition to the clock period Tck. However, embodiments of the inventive concept are not limited thereto. In another embodiment, the first pre-pulse signal Ci and the second pre-pulse signal Cs may be synchronized with the clock signal CLK.

The pre-processing pulse generator 112a may generate a first pulse signal DLLi and a second pulse signal DLLs based on the clock signal CLK, the first pre-pulse signal Ci, and the second pre-pulse signal Cs. The pre-processing pulse generator 112a may output the first pre-pulse signal as the first pulse signal DLLi and the second pre-pulse signal as the second pulse signal DLLs in synchronization with the clock signal CLK.

The pre-processing pulse generator 112a may include a first flip-flop FF1 and a second flip-flop FF2. The first flip-flop FF1 may output the first pre-pulse signal Ci as the first pulse signal DLLi in synchronization with the clock signal CLK. The second flip-flop FF2 may output the second pre-pulse signal Cs as the second pulse signal DLLs in synchronization with the clock signal CLK. Accordingly, as illustrated in FIG. 9B, the first pulse signal DLLi and the second pulse signal DLLs may be synchronized with the clock signal CLK, and a phase difference between the first pulse signal DLLi and the second pulse signal DLLs may be an integer multiple of the clock period Tck of the clock signal CLK.

Figure 10A:
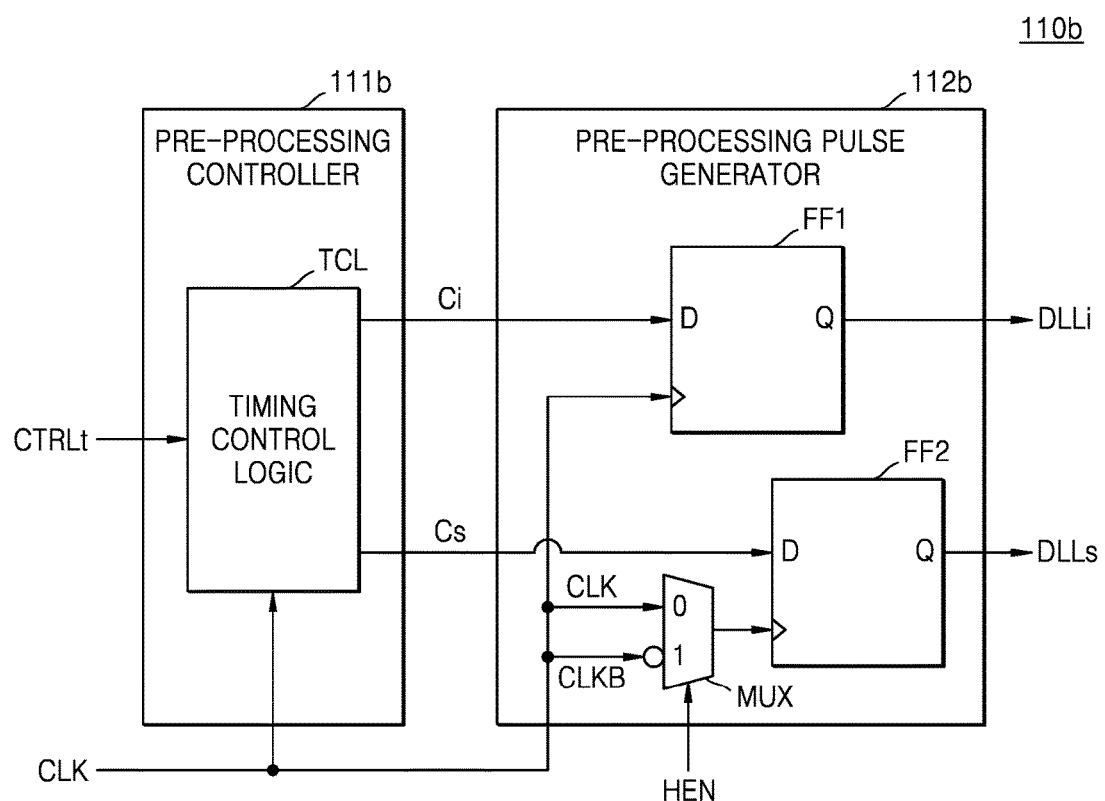
FIG. 10A is a block diagram of a pre-processing circuit of a DLL circuit, according to an exemplary embodiment.
Figure 10B:
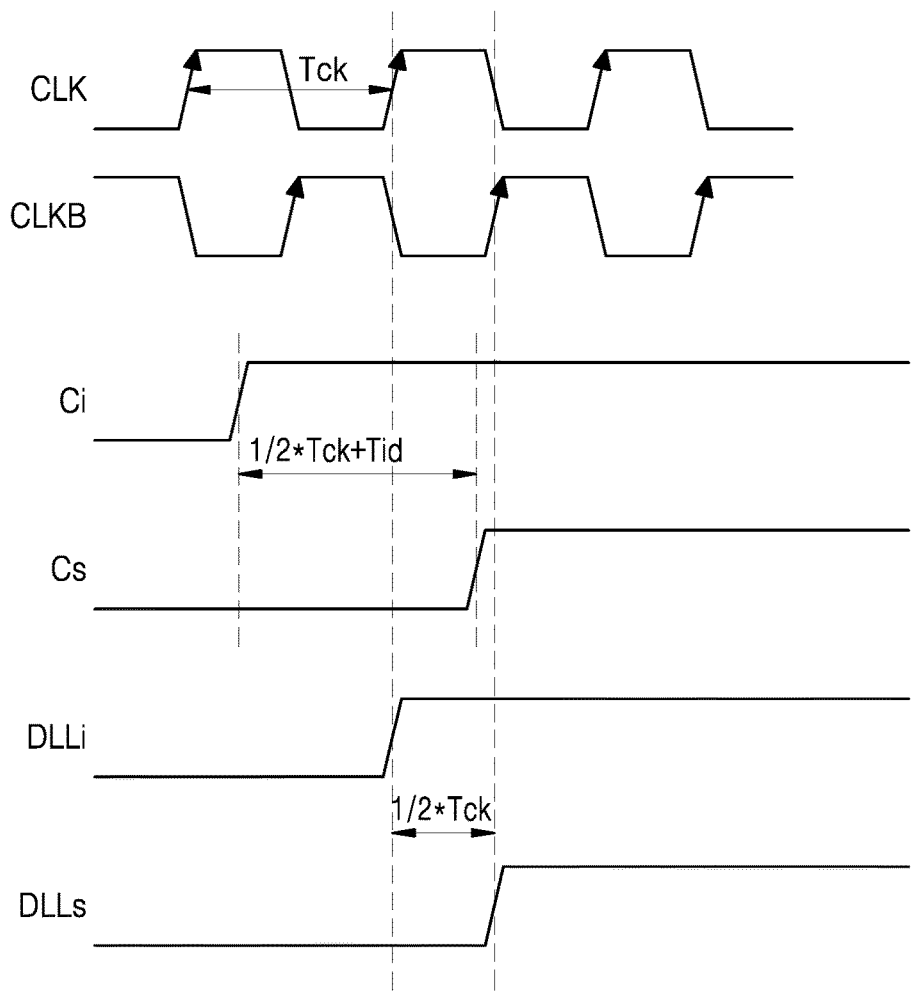
FIG. 10B is a timing diagram for describing an operation of the pre-processing circuit of FIG. 10A.

FIG. 10A is a block diagram of a pre-processing circuit 110b of the DLL circuit, according to an exemplary embodiment, and FIG. 10B is a timing diagram of the pre-processing circuit 110b.

As shown in FIG. 10A, the pre-processing circuit 110b may include a pre-processing controller 111b and a pre-processing pulse generator 112b. Since the operation of the pre-processing controller 111b may be substantially the same as the operation of the pre-processing controller 111a of FIG. 9A, redundant descriptions thereof will be omitted.

The pre-processing pulse generator 112b may include a first flip-flop FF1, a second flip-flop FF2, and a selector MUX. The selector MUX may be a multiplexer.

The first flip-flop FF1 may output a first pre-pulse signal Ci as a first pulse signal DLLi in synchronization with a clock signal CLK. The second flip-flop FF2 may output a second pre-pulse signal Cs as a second pulse signal DLLs in synchronization with the clock signal CLK or a complementary clock signal CLKB of the clock signal CLK (hereinafter, simply referred to as a complementary clock signal). As illustrated in FIG. 10B, a phase of the complementary clock signal CLKB may lag behind a phase of the clock signal CLK by a half clock period (½)×Tck.

The selector MUX may provide the clock signal CLK or the complementary clock signal CLKB to the second flip-flop FF2 in response to a half clock enable signal HEN. For example, when the half clock enable signal HEN is in a disabled state (e.g., when the half clock enable signal HEN is at logic low), the selector MUX may provide the clock signal CLK to the second flip-flop FF2. When the half clock enable signal HEN is in an enabled state (e.g., when the half clock enable signal HEN is at logic high), the selector MUX may provide the complementary clock signal CLKB to the second flip-flop FF2. The complementary clock signal CLKB is generated by inverting the clock signal CLK.

Accordingly, when the half clock enable signal HEN is in a disabled state, the second flip-flop FF2 may output the second pulse signal DLLs in synchronization with the clock signal CLK, and when the half clock enable signal HEN is in an enabled state, the second flip-flop FF2 may output the second pulse signal DLLs in synchronization with the complementary clock signal CLKB.

The operation of the pre-processing circuit 110b when the half clock enable signal HEN is in the disabled state may be substantially the same as the operation of the pre-processing circuit 110a of FIG. 9A, and the timing diagram of the pre-processing circuit 110b may be substantially the same as the timing diagram of FIG. 9B.

FIG. 10B is a timing diagram of the pre-processing circuit 110b when the half clock enable signal HEN is in an enabled state. For example, when a phase difference between the first pulse signal DLLi and the second pulse signal DLLs is set to be the half clock period (½)×Tck, a phase difference between the first pre-pulse signal Ci and the second pre-pulse signal Cs may be set based on the half clock period (½)×Tck or one clock period Tck. The phase difference between the first pre-pulse signal Ci and the second pre-pulse signal Cs may further include a delay component Tid.

Since the first pre-pulse signal Ci is output as the first pulse signal DLLi in synchronization with the clock signal CLK and the second pre-pulse signal Cs is output as the second pulse signal DLLs in synchronization with the complementary clock signal CLKB, the phase difference between the first pulse signal DLLi and the second pulse signal DLLs may be set to be the half clock period (½)×Tck.

On the other hand, when the phase difference between the first pre-pulse signal Ci and the second pre-pulse signal Cs is set based on 1.5 times or twice the clock period Tck, the phase difference between the first pulse signal DLLi and the second pulse signal DLLs may be set to be 1.5 times the clock period Tck, that is, 1.5×Tck. As described above, the phase difference between the first pulse signal DLLi and the second pulse signal DLLs may be set to be the sum of the integer multiple of the clock period Tck and the half clock period (½)×Tck, based on the phase difference between the first pre-pulse signal Ci and the second pre-pulse signal Cs.

The pre-processing circuits 110a and 110b according to the exemplary embodiments have been described above with reference to FIGS. 9A to 10B. However, exemplary embodiments of the present disclosure are not limited thereto. The configuration of the pre-processing circuit and the operations of the elements thereof may be changed within the technical scope of generating the first pulse signal DLLi and the second pulse signal DLLs having a phase difference of (s/2)×Tck, based on the clock signal CLK.

Figure 11A:
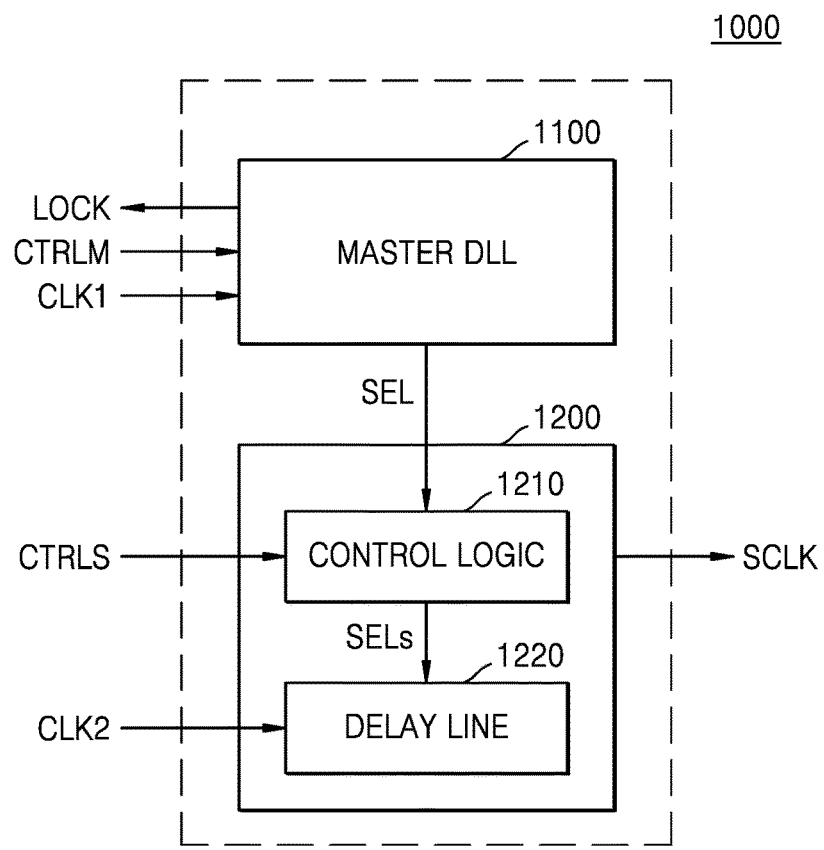
FIG. 11A is a block diagram of an integrated circuit (IC) according to an embodiment.
Figure 11B:
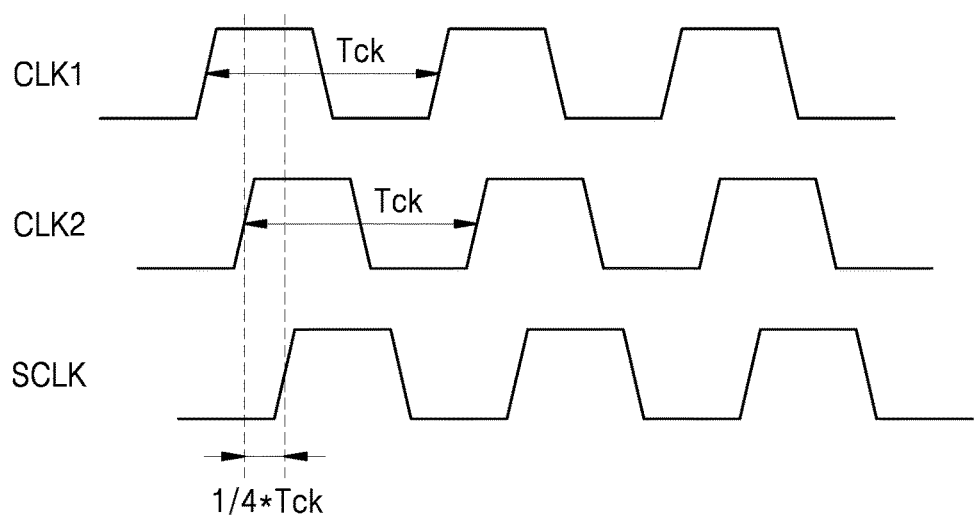
FIG. 11B is a timing diagram for clock signals of the integrated circuit of FIG. 11A.

FIG. 11A is a block diagram of an integrated circuit (IC) 1000 according to an exemplary embodiment, FIG. 11B is a timing diagram for clock signals of the integrated circuit of FIG. 11A, and FIG. 11C illustrates various exemplary embodiments of setting the slave selection value of the integrated circuit of FIG. 11A.

As shown in FIG. 11A, the IC 1000 may include a master DLL circuit 1100 and at least one slave DLL circuit 1200. The master DLL circuit 1100 and the at least one slave DLL circuit 1200 may constitute a DLL block.

The DLL circuits described above with reference to FIGS. 1 to 10B may be implemented as the master DLL circuit 1100. The master DLL circuit 1100 may generate a selection value SEL based on a control signal (e.g., a master control signal CTRLM) and a clock signal (e.g., a first clock signal CLK1). The first clock signal CLK1 may be a reference clock signal of the IC 1000. Particularly, the master DLL circuit 1100 may generate a first pulse signal and a second pulse signal having a phase difference based on a clock period (Tck) of the first clock signal CLK1, and detect a lock state based on the first pulse signal and the second pulse signal. The phase difference between the first pulse signal and the second pulse signal may be varied according to a reference delay amount set for the master DLL circuit 1100. The phase difference between the first pulse signal and the second pulse signal may be equal to the reference delay amount.

When the master DLL circuit 1100 becomes the lock state, the master DLL circuit 1100 may generate a lock signal LOCK and provide the lock signal LOCK to a DLL control circuit or the slave DLL circuit 1200. The selection value SEL corresponding to the lock signal LOCK indicates a reference selection value corresponding to a reference delay amount set to the master DLL circuit 1100. For example, when the reference delay amount is twice the clock period Tck of the first clock signal CLK1, the selection value SEL corresponding to the lock signal LOCK may be twice the clock period, that is, 2×Tck. In another example, when the reference delay amount is equal to one clock period Tck of the first clock signal CLK1, the selection value SEL corresponding to the lock signal LOCK may be one clock period Tck.

The slave DLL circuit 1200 may generate an internal clock signal SCLK by delaying an input clock signal (e.g., a second clock signal CLK2) by a target delay amount (or, referred to a target phase difference) set to the slave DLL circuit 1200, based on the selection value SEL provided from the master DLL circuit 1100. As illustrated in FIG. 11B, a clock period of the second clock signal CLK2 may be equal to one clock period Tck of the first clock signal CLK1. However, embodiments of the inventive concept are not limited thereto. The clock period of the second clock signal CLK2 may be an integer multiple of the clock period Tck of the first clock signal CLK1. According to an aspect of an exemplary embodiment, the second clock signal CLK2 may be generated based on the first clock signal CLK1.

The slave DLL circuit 1200 may include a control logic 1210 and a delay line 1220. The control logic 1210 may generate a slave selection value SELs based on a control signal, for example, a slave control signal CTRLS, and a selection value SEL. The slave control signal CTRLS may include information indicating a target delay amount of the slave DLL circuit 1200 and a reference delay amount of the master DLL circuit 1100. The control logic 1210 may generate the slave selection value SELs corresponding to the target delay amount, based on the reference delay amount and the selection value SEL.

The delay line 1220 may generate the internal clock signal SCLK by delaying the second clock signal CLK2 by the delay amount set based on the slave selection value SELs. A unit delay cell of the delay line 1220 may be the same as a unit delay cell of a delay line included in the master DLL circuit 1100. Accordingly, a unit delay amount of the unit delay cell may be equal to a unit delay amount of the unit delay cell included in the master DLL circuit 1100.

When the clock period of the second clock signal CLK2 is equal to one clock period Tck of the first clock signal CLK1 and the target delay amount of the slave DLL circuit 1200 is 90 degrees, the slave selection value SELs that sets the delay amount of the delay line 1220 to be (¼)×Tck may be provided to the delay line 1220.

When the selection value SEL corresponds to one clock period Tck, in other words, when one clock period Tck of the first clock signal CLK1 is set as the reference delay amount of the master DLL circuit 1100, the slave selection value SELs may be a value calculated by dividing the selection value SEL by 4, that is, SEL/4. Accordingly, as illustrated in FIG. 11B, an internal clock signal SCLK obtained by delaying the second clock signal CLK2 by 90 degrees, that is, (¼)×Tck, may be generated.

The slave selection value SELs may be variously set according to the reference delay amount of the master DLL circuit 1100, the target delay amount of the slave DLL circuit 1200, and the clock period of the second clock signal CLK2. Referring to FIG. 11C, various embodiments for setting the slave selection values SELs will be described.

Referring to FIG. 11C, the reference delay amount TDref of the master DLL circuit 1100, the clock period Tck2 of the second clock signal CLK2, and the target delay amount TDts of the slave DLL circuit 1200 may be variously set.

For example, when the reference delay amount TDref is set equal to the clock period Tck of the first clock signal CLK1 (hereinafter referred to as a first clock period) and the clock period Tck2 of the second clock signal (hereinafter referred to as a second clock period) is set equal to a first clock period Tck, if the target delay amount TDts is set to 90 degrees, the slave selection value SELs may be set to ¼×SEL. If the target delay amount TDts is set to 180 degrees, the slave selection value SELs may be set to ½×SEL. If the target delay amount TDts is set to 270 degrees, the slave selection value SELs may be set to ¾×SEL and if the target delay amount TDts is set to 360 degrees, the slave selection value SELs may be set to SEL.

For another example, when the reference delay amount TDref is set to be equal to the first clock period Tck and the second clock period Tck2 is set to twice the first clock period Tck (that is, 2×Tck), the selection value SEL corresponds to the first clock period Tck, and if the target delay amount TDts is set to 90 degrees, the slave selection value SELs may be set to ½×SEL. If the target delay amount TDts is set to 180 degrees, the slave selection value SELs may be set to SEL. If the target delay amount TDts is set to 270 degrees, the slave selection value SELs may be set to 3/2×SEL and if the target delay amount TDts is set to 360 degrees, the slave selection value SELs may be set to 2×SEL.

When the reference delay amount TDref is set to twice the first clock period Tck (i.e., 2×Tck) and the second clock period Tck2 is set to the first clock period Tck, the selection value SEL corresponds to twice the first clock period Tck (i.e., 2×Tck) and if the target delay amount TDts is set to 90 degrees, the slave selection value SELs may be set to ⅛×SEL. If the target delay amount TDts is set to 180 degrees, the slave selection value SELs may be set to ¼×SEL. If the target delay amount TDts is set to 270 degrees, the slave selection value SELs may be set to ⅜×SEL and if the target delay amount TDts is set to 360 degrees, the slave selection value SELs may be set to ½×SEL.

When the reference delay amount TDref is set to twice the first clock period Tck (i.e., 2×Tck) and the second clock period Tck2 is set to twice the first clock period Tck (i.e., 2×Tck), the selection value SEL corresponds to twice the first clock period Tck (i.e., 2×Tck), so that, if the target delay amount TDts is set to 90 degrees, the slave selection value SELs may be set to ¼×SEL. If the target delay amount TDts is set to 180 degrees, the slave selection value SELs may be set to ½×SEL. If the target delay amount TDts is set to 270 degrees, the slave selection value SELs may be set to ¾×SEL and if the target delay amount TDts is set to 360 degrees, the slave selection value SELs may be set to SEL.

Various examples for setting the slave selection values SELs have been described above with reference to FIG. 11C. However, exemplary embodiments of the present disclosure are not limited thereto, and the slave selection value SELs may be variously set according to the reference delay amount TDref, the target delay amount TDts, and the clock period Tck2 of the second clock signal CLK2.

In FIG. 11A, the clock period of the first clock signal CLK1 and the clock period of the second clock signal CLK2 may change according to PVT variations. When the slave selection value SELs has a fixed value, the delay amount of the internal clock signal SCLK (in other words, the phase difference between the second clock signal CLK2 and the internal clock signal SCLK) may change according to PVT variations. However, the master DLL circuit 1100 changes according to PVT variations, the selection value SEL corresponding to (s/2)×Tck is generated, and the slave DLL circuit 1200 generates the slave selection value SELs based on the selection value SEL. Thus, it is possible to compensate for PVT variations and constantly maintain the delay amount of internal clock signal SCLK.

On the other hand, as described above with reference to FIGS. 1 to 10B, since the master DLL circuit 1100 detects the selection value SEL corresponding to the lock state, based on the first pulse signal DLLi and the second pulse signal DLLs generated based on the first clock signal CLK1, the master DLL circuit 1100 may quickly detect the selection value SEL. Therefore, the IC 1000 may quickly compensate for PVT variations, and the slave DLL circuit 1200 may stably generate the internal clock signal SCLK. Also, since dynamic power consumption of the delay line of the master DLL circuit 1100 is reduced, power consumption of the IC 1000 may be reduced.

Figure 12:
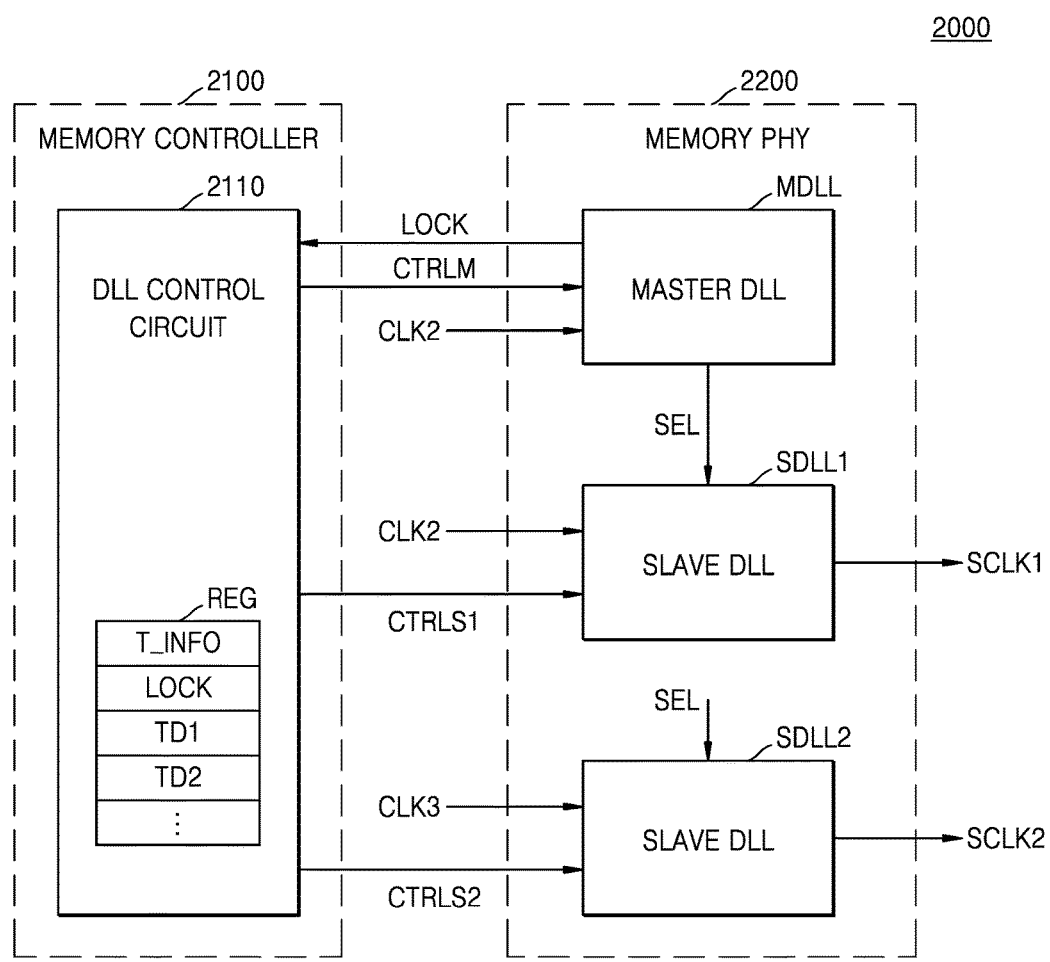
FIG. 12 is a block diagram of an IC according to another embodiment.

FIG. 12 is a block diagram of an IC 2000 according to an exemplary embodiment.

The IC 2000 of FIG. 12 may be a memory interface circuit configured to transmit data to a memory and receive data from the memory. The IC 2000 may include a memory controller 2100 and a memory physical layer 2200.

The memory controller 2100 may include a DLL control circuit 2110, and the memory physical layer 2200 may include a master DLL circuit MDLL and a plurality of slave DLL circuits SDLL1 and SDLL2. Two slave DLL circuits SDLL1 and SDLL2, that is, the first and second slave DLL circuits, are illustrated in FIG. 12, but an exemplary embodiment is not limited thereto. The memory physical layer 2200 may include three or more slave DLL circuits.

The DLL control circuit 2110 may include a register REG. The register REG may store a variety of control information and/or various setting values for the master DLL circuit MDLL and the slave DLL circuits SDLL1 and SDLL2. For example, the register REG may store timing information T_INFO of the master DLL circuit MDLL. The timing information T_INFO may include an initial selection value, a control loop period, a unit increase value, or a unit decrease value. The timing information T_INFO may be provided to the master DLL circuit MDLL as a master control signal CTRLM. According to an embodiment, the timing information T_INFO may further include a reference delay amount. The master DLL circuit MDLL may detect the selection value corresponding to the reference delay amount (e.g., s/2 times the clock period Tck of the first clock signal CLK1).

Also, the register REG may store target delay amount information TD1 and TD2 of the slave DLL circuits SDLL1 and SDLL2. The target delay amount information TD1 of the first slave DLL circuit SDLL1 may be included in a first slave control signal CTRLS1 and then provided to the first slave DLL circuit SDLL1. The target delay amount information TD2 of the second slave DLL circuit SDLL2 may be included in a second slave control signal CTRLS2 and then provided to the second slave DLL circuit SDLL2.

The register REG may store the lock signal LOCK provided from the master DLL circuit MDLL and may further store other control information and other setting values for controlling the master DLL circuit MDLL and the slave DLL circuits SDLL1 and SDLL2.

The master DLL circuit MDLL may detect the selection value SEL corresponding to the lock state based on the first clock signal CLK1. The master DLL circuit MDLL may operate based on the master control signal CTRLM provided from the DLL control circuit 2110.

The master DLL circuit MDLL may provide the selection value SEL to the first slave DLL circuit SDLL1 and the second slave DLL circuit SDLL2. The master DLL circuit MDLL may provide the lock signal LOCK to the DLL control circuit 2110. The lock signal LOCK may indicate whether the selection value SEL provided to the first slave DLL circuit SDLL1 and the second slave DLL circuit SDLL2 is valid, that is, whether the selection value SEL corresponds to the lock state. Information about the validity of the selection value SEL may be respectively included in the first slave control signal CTRLS1 and the second slave control signal CTRLS2 and provided to the first slave DLL circuit SDLL1 and the second slave DLL circuit SDLL2. According to an aspect of an exemplary embodiment, the lock signal LOCK may be directly provided to the first slave DLL circuit SDLL1 and the second slave DLL circuit SDLL2.

The first slave DLL circuit SDLL1 may operate based on the first slave control signal CTRLS1 and generate the first internal clock signal SCLK1 based on the second clock signal CLK2 and the selection value SEL. The clock period of the second clock signal CLK2 may be a positive integer multiple of the clock period of the first clock signal CLK1.

The second slave DLL circuit SDLL2 may operate based on the second slave control signal CTRLS2 and generate the second internal clock signal SCLK2 based on the third clock signal CLK3 and the selection value SEL. The clock period of the third clock signal CLK3 may be a positive integer multiple of the clock period of the first clock signal CLK1.

The slave DLL circuit 1200 described above with reference to FIG. 11A may be applied to the first slave DLL circuit SDLL1 and the second slave DLL circuit SDLL2. The first slave DLL circuit SDLL1 and the second slave DLL circuit SDLL2 may respectively generate the first internal clock signal SCLK1 and the second internal clock signal SCLK2, in which PVT variations are compensated for, based on the selection value SEL provided from the master DLL circuit. According to an embodiment, a target delay amount of the first slave DLL circuit SDLL1 may be different from a target delay amount of the second slave DLL circuit SDLL2.

The DLL circuit 100 described above with reference to FIGS. 1 to 10B may be applied to the master DLL circuit MDLL included in the IC 2000 of FIG. 12. The master DLL circuit MDLL may include a pre-processing circuit. The pre-processing circuit may pre-process the first clock signal CLK1 to generate a first pulse signal and a second pulse signal having a phase difference of (s/2) times the clock period Tck of the first clock signal CLK1 (where s is a positive integer), and detect the selection value SEL based on the first pulse signal and the second pulse signal. Accordingly, the control logic of the master DLL circuit MDLL may be simplified and the power consumption of the master DLL circuit MDLL may be reduced. Also, the time necessary to detect the selection value SEL may be shortened. Therefore, data reception or transmission characteristics of the IC 2000 may be improved and the power consumption of the IC 2000 may be reduced.

While the present disclosure has been particularly shown and described with reference to various exemplary embodiments thereof, it will be understood that various changes in form and details may be made therein without departing from the spirit and scope of the following claims.

What is claimed is:

1. A delay-locked loop (DLL) circuit comprising:
a pre-processing circuit configured to generate a first pulse signal and a second pulse signal based on a clock signal, the first pulse signal and the second pulse signal having a first phase difference of (s/2) times a clock period of the clock signal, wherein s is a positive integer, and wherein the pre-processing circuit includes a pulse generator which outputs two pre-pulse signals having a phase difference as the first pulse signal and the second pulse signal, in synchronization with the clock signal;
a delay line configured to receive the first pulse signal and generate a delay signal by delaying the first pulse signal by a delay amount corresponding to a selection value;
a phase detector configured to receive the delay signal and the second pulse signal, and detect a second phase difference between the delay signal and the second pulse signal; and
a control logic configured to adjust the selection value based on the second phase difference detected by the phase detector, so as to synchronize the delay signal with the second pulse signal.

2. The DLL circuit of claim 1, wherein a phase of the first pulse signal leads a phase of the second pulse signal.

3. The DLL circuit of claim 1, wherein a phase of the first pulse signal leads a phase of the second pulse signal by the clock period of the clock signal.

4. The DLL circuit of claim 1, wherein a phase of the first pulse signal leads a phase of the second pulse signal by half the clock period of the clock signal.

5. The DLL circuit of claim 1, wherein the phase detector is further configured to detect the second phase difference between the delay signal and the second pulse signal at each control loop period, and
wherein a period of each of the first pulse signal and the second pulse signal is substantially equal to the control loop period.

6. The DLL circuit of claim 5, wherein the control loop period is equal to the clock period multiplied by an integer greater than 1.

7. The DLL circuit of claim 1, wherein the phase detector is further configured to detect the second phase difference by sampling a level of the delay signal at each rising edge or each falling edge of the second pulse signal.

8. The DLL circuit of claim 1, wherein, when the delay signal and the second pulse signal are in phase, the control logic is further configured to generate a lock signal and output the lock signal and the selection value to an external circuit.

9. The DLL circuit of claim 1, wherein the pre-processing circuit further comprises:
a pre-processing controller configured to generate a first pre-pulse signal and a second pre-pulse signal of the two pre-pulse signals based on the clock signal.

10. The DLL circuit of claim 9, wherein the pulse generator is further configured to output the second pre-pulse signal as the second pulse signal in synchronization with a complementary clock signal of the clock signal in response to a half clock enable signal.

11. An integrated circuit (IC) comprising:
a digital delay-locked loop (DLL) circuit configured to generate a reference selection value corresponding to a reference delay amount based on a first pulse signal and a second pulse signal, the first pulse signal and the second pulse signal being generated based on a first clock signal; and
at least one slave DLL circuit configured to generate an internal clock signal by delaying a second clock signal based on the reference selection value,
wherein the digital DLL circuit comprises:

a pre-processing circuit configured to generate the first pulse signal and the second pulse signal based on the first clock signal, the first pulse signal and the second pulse signal having a first phase difference corresponding to the reference delay amount, wherein the pre-processing circuit includes a pulse generator which outputs two pre pulse signals having a phase difference as the first pulse signal and the second pulse signal, in synchronization with the first clock signal;

a delay line configured to receive the first pulse signal, and generate a delay signal by delaying the first pulse signal by a delay amount corresponding to a selection value;

a phase detector configured to receive the delay signal and the second pulse signal and detect a second phase difference between the delay signal and the second pulse signal; and a control logic configured to adjust the selection value based on the second phase difference detected by the phase detector and provide the selection value, which is selected to have the delay signal synchronized with the second pulse signal, as the reference selection value to the at least one slave DLL circuit.

12. The IC of claim 11, wherein the first phase difference between the first pulse signal and the second pulse signal is s/2 times a period of the first clock signal, wherein s is a positive integer.

13. The IC of claim 11, wherein a period of each of the first pulse signal and the second pulse signal is equal to a period of the first clock signal multiplied by an integer greater than 1.

14. The IC of claim 11, wherein the at least one slave DLL circuit is further configured to generate the internal clock signal by delaying the second clock signal by a target delay amount based on the reference delay amount and the reference selection value.

15. The IC of claim 11, wherein the reference selection value varies according to at least one of a manufacturing process, a voltage, and a temperature, and wherein the at least one slave DLL circuit is further configured to compensate for a variation in the internal clock signal according to at least one of the manufacturing process, the voltage, and the temperature.

16. A method comprising:

generating, at a delay-locked loop (DLL) circuit, a first pulse signal and a second pulse signal based on a clock signal input, the first pulse signal and the second pulse signal having a first phase difference of (s/2) times a clock period of the clock signal input, wherein s is a positive integer;

generating a first delay signal by delaying the first pulse signal by a first delay amount corresponding to a first selection value;

detecting a second phase difference between the first delay signal and the second pulse signal;

determining a second selection value based on the second phase difference; and generating a second delay signal by delaying the first pulse signal by a second delay amount corresponding to the second selection value, wherein the generating the first pulse signal and the second pulse signal comprises outputting two pre-pulse signals having a phase difference as the first pulse signal and the second pulse signal in synchronization with the clock signal input.

17. The method of claim 16, wherein the second delay signal is synchronized with the second pulse signal.

18. The method of claim 16, wherein the first phase difference is equal to the clock period of the clock signal input.

19. The method of claim 16, wherein the determining the second selection value comprises:

in response to the first delay signal leading the second pulse signal, determining the second selection value by adding a unit increase value to the first selection value; and in response to the first delay signal lagging behind the second pulse signal, determining the second selection value by subtracting a unit decrease value from the first selection value.

20. The method of claim 19, wherein the unit increase value is equal to the unit decrease value.

* * * * *